(12) United States Patent
Hsu et al.

(10) Patent No.: US 7,206,913 B2
(45) Date of Patent: Apr. 17, 2007

(54) HIGH SPEED MEMORY SYSTEM

(75) Inventors: Fu-Chieh Hsu, Saratoga, CA (US); Wingyu Leung, Cupertino, CA (US)

(73) Assignee: Monolithic System Technology, Inc., Sunnyvale, CA (US)

( * ) Notice: Subject to any disclaimer, the term of this patent is extended or adjusted under 35 U.S.C. 154(b) by 113 days.

(21) Appl. No.: 10/927,157

(22) Filed: Aug. 25, 2004

(65) Prior Publication Data

US 2005/0027929 A1 Feb. 3, 2005

Related U.S. Application Data

(60) Division of application No. 10/329,015, filed on Dec. 23, 2002, now abandoned, which is a continuation of application No. 09/851,713, filed on May 8, 2001, now Pat. No. 6,510,492, which is a continuation of application No. 09/153,099, filed on Sep. 14, 1998, now Pat. No. 6,295,593, which is a continuation of application No. 08/942,254, filed on Oct. 1, 1997, now Pat. No. 6,128,700, which is a continuation of application No. 08/443,998, filed on May 17, 1995, now abandoned.

(51) Int. Cl.
*G06F 12/00* (2006.01)
(52) U.S. Cl. .................................................. 711/167
(58) Field of Classification Search ................ 711/105, 711/167
See application file for complete search history.

(56) References Cited

U.S. PATENT DOCUMENTS

| 4,464,715 A | 8/1984 | Stamm ........................ 395/550 |
| 4,755,930 A | 7/1988 | Wilson, Jr. et al. ......... 395/449 |
| 5,113,506 A | 5/1992 | Moussouris et al. ........ 395/403 |
| 5,164,621 A | 11/1992 | Miyamoto .................. 307/591 |

(Continued)

FOREIGN PATENT DOCUMENTS

JP   04-307395   10/1992

OTHER PUBLICATIONS

INTEL, Pentium Processor 2.3V Pipelined BSRAM Specification, Oct. 5, 1994, pp. 1-39.

(Continued)

*Primary Examiner*—Kevin L. Ellis
(74) *Attorney, Agent, or Firm*—Bever, Hoffman & Harms, LLP; E. Eric Hoffman

(57) ABSTRACT

A method and structure for implementing a DRAM memory array as a second level cache memory in a computer system. The computer system includes a central processing unit (CPU), a first level SRAM cache memory, a CPU bus coupled to the CPU, and second level cache memory which includes a DRAM array coupled to the CPU bus. When accessing the DRAM array, row access and column decoding operations are performed in a self-timed asynchronous manner. Predetermined sequences of column select operations are then performed in a synchronous manner with respect to a clock signal. A widened data path is provided to the DRAM array, effectively increasing the data rate of the DRAM array. By operating the DRAM array at a higher data rate than the CPU bus, additional time is provided for precharging the DRAM array. As a result, precharging of the DRAM array is transparent to the CPU bus.

11 Claims, 17 Drawing Sheets

U.S. PATENT DOCUMENTS

| | | | | |
|---|---|---|---|---|
| 5,226,009 | A | 7/1993 | Arimoto | 365/189.04 |
| 5,249,282 | A | 9/1993 | Segers | 395/449 |
| 5,265,102 | A | 11/1993 | Saito | 371/27 |
| 5,293,603 | A | 3/1994 | MacWilliams et al. | 395/309 |
| 5,305,280 | A | 4/1994 | Hayano | 365/230.03 |
| 5,357,479 | A | 10/1994 | Matsui | 365/230.06 |
| 5,422,858 | A | 6/1995 | Mizukami et al. | 365/233 |
| 5,463,584 | A | 10/1995 | Hoshino | 365/189.05 |
| 5,509,132 | A | 4/1996 | Matsuda et al. | 395/403 |
| 5,511,031 | A | 4/1996 | Grover et al. | 365/208 |
| 5,561,779 | A | 10/1996 | Jackson et al. | 395/449 |
| 5,587,953 | A | 12/1996 | Chung | 365/220 |
| 5,615,355 | A | 3/1997 | Wagner | 711/167 |
| 5,784,705 | A * | 7/1998 | Leung | 711/169 |
| 5,867,178 | A | 2/1999 | Murphy et al. | 345/507 |

OTHER PUBLICATIONS

IDT, Advanced Information IDT71V432, "32K×32 CacheRAM Pipelined/Flow Through Outputs Burst Counter, & Self-Timed Write-for Pentium/PowerPC Processors," May 1994, pp. 1-2.

IDT, Preliminary IDT71430. "32K×18 CacheRAM Burst Counter & Self-Timed Write-For the Penium Processor." May 1994, pp. 1-8.

Przybylski, Steven, "New DRAM Technologies, A Comprehensive Analysis of the New Architectures," MicroDesign Resources, pp. 111-216, 357, 578, Apr. 1994.

Preliminary Data Sheet. KM741006J CMOS SRAM, "262,144 Words x 4-Bit Synchronous Static Random Access Memory," Samsung Electronics, pp. 348-354 (author unknown), 1994.

OPTi 82C803/82C822 PCI Chipset Overview, OPTi, Inc.. Jun. 3, 1993, pp. 4-8.

OPTi 486SXWB Overview (82C493/82C392/82C206 Chipset), OPTi. Inc. pp. 5-11, Aug. 16, 1991.

INTEL 82430 PCIset for the Pentium Processor, Advance Information, Intel Corporation, Mar. 1993, pp. 1-7.

INTEL 82420 PCIset, Advance Information, Intel Corporation. Apr. 1993, pp. 1, 12-15, 27-32.

Tuite, "Cache architecture under pressure to match CPU performance". Computer Design, V32, No. 3, Mar. 1993, p. 91(6).

Bursky, "Combination of DRAM-SRAM removes secondary caches," Electronic Design, V40, No. 2. Jan. 23, 1992. p. 39(4).

* cited by examiner

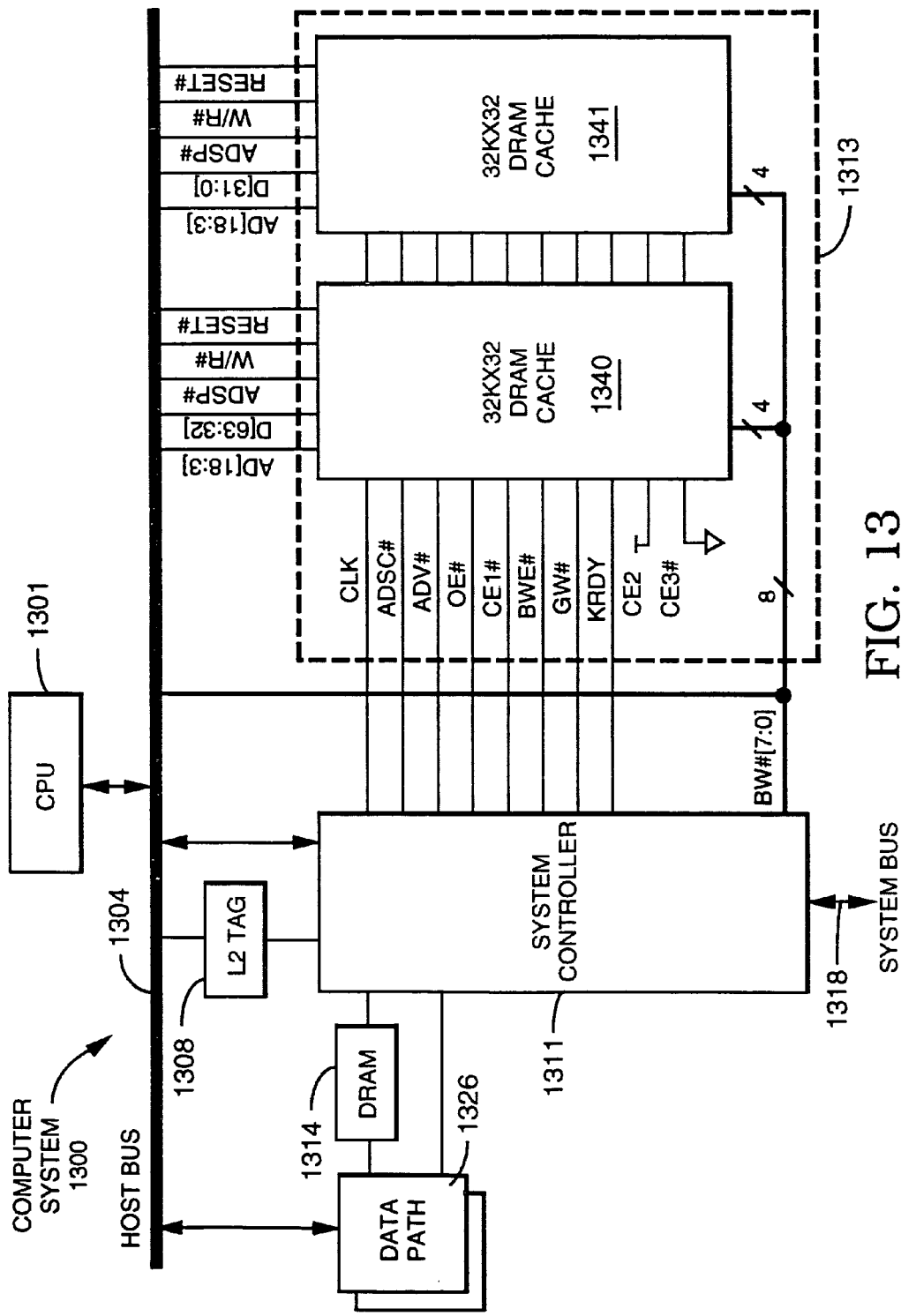

HIGH SPEED MEMORY SYSTEM

RELATED APPLICATIONS

This is a divisional of U.S. patent application Ser. No. 10/329,015 entitled "High Speed Memory System," filed Dec. 23, 2002 now abandoned by Fu-Chieh Hsu and Wingyu Leung, which is a continuation of application Ser. No. 09/851,713 filed May 8, 2001, now U.S. Pat. No. 6,510,492 entitled "Apparatus For Controlling Data Transfer Between A Bus And Memory Array And Method For Operating Same," by Hsu, et al., which is a continuation of application Ser. No. 09/153,099, filed Sep. 14, 1998, now U.S. Pat. No. 6,295,593 entitled "Method Of Operating Memory Array With Write Buffers And Related Apapratus," by Hsu, et al., which is a continuation of application Ser. No. 08/942,254, filed Oct. 1, 1997, now U.S. Pat. No. 6,128,700 entitled "System Utilizing A DRAM Array As A Next Level Cache Memory And Method For Operating Same," by Hsu, et al., which is a continuation of U.S. patent application Ser. No. 08/443,998 filed May 17, 1995, now abandoned, entitled "Method And Structure For Utilizing A DRAM Array As Second Level Cache Memory," by Hsu, et al., all of which are incorporated herein by reference.

BACKGROUND OF THE INVENTION

1. Field of the Invention

The present invention relates to a method and structure for implementing a memory system. More specifically, the invention relates to a second level cache memory.

2. Description of the Prior Art

High-speed computer systems frequently use fast, small-capacity cache (buffer) memory to transmit signals between a fast processor and a slow (and low cost), large-capacity main memory. Cache memory is typically used to temporarily store data which has a high probability of being selected next by the processor. By storing this high probability data in a fast cache memory, the average speed of data access for the computer system is increased. Thus, cache memory is a cost effective way to boost system performance (as compared to using all high speed, expensive memories) In more advanced computer systems, there are multiple levels (usually two levels) of cache memory. The first level cache memory, typically having a storage of 4 Kbytes to 32 Kbytes, is ultra-fast, and is usually integrated on the same chip with the processor. The first level cache is faster because it is integrated with the processor and therefore avoids any delay associated with transmitting signals to and receiving signals from an external chip. The second level cache is usually located on a different chip than the processor, and has a larger capacity, usually from 64 Kbytes to 1024 Kbytes.

FIG. J. is a block diagram of a prior art computer system 100 using an SRAM second level cache configuration. The CPU or microprocessor 101 incorporates on-chip SRAM first level cache 102 to support the very fast internal CPU operations (typically from 33 Mhz to 150 Mhz).

First level cache 102 typically has a capacity of 4 Kbytes to 32 Kbytes and performs very high speed data and instruction accesses (typically with S to 15 ns). For first-level cache miss or other non-cacheable memory accesses, the memory read and write operations must go off-chip through the much slower external CPU bus 104 (typically from 25 Mhz to 60 Mhz) to the SRAM second level (L2) cache 106 (typically with 128 Kbytes to 1024 Kbytes capacity) with the additional latency (access time) penalty of round-trip off-chip delay.

The need for CPU 101 to manage the delay penalty of off-chip operation dictates that in almost all modern microprocessors, the fastest access cycle (read or write) through the CPU bus 104 is 2-1-1-1. That is, the first external access will consume at least 2 clock cycles, and each subsequent external access will consume a single clock cycle. At higher CPU bus frequencies, the fastest first external access may take 3 or more clock cycles. A burst cycle having 4 accesses is mentioned here for purposes of illustration only. Some processors allow shorter (e.g., 2) or longer (e.g., 8 or more) burst cycles. Pipelined operation, where the parameters of the first external access of the second burst cycle are latched into CPU bus devices while the first burst cycle is still in progress, may hide the longer access latency for the first external access of the second burst cycle. Thus, the first and second access cycles may be 2-1-1-1, 1-1-1-1, respectively.

The cache tag memory 108 is usually relative small (from 8 Kbytes to 32 Kbytes) and fast (typically from 10 to 15 ns) and is implemented using SRAM cells. Cache tag memory 108 stores the addresses of the cache lines of second level cache 106 and compares these addresses with an access address on CPU bus 104 to determine if a cache hit has occurred. This small cache tag memory 108 can be integrated with the system logic controller chip 110 for better speed and lower cost. An integrated cache tag memory operates in the same manner as an external cache tag memory. Intel's 82430 PCI set for the Pentium processor is one example of a logic controller chip 110 which utilizes an SRAM integrated cache tag memory.

One reason for the slower operating frequency of CPU bus 104 is the significant loading caused by the devices attached to CPU bus 104. Second level (L2) SRAM cache memory 106 provides loading on the data and address buses (through latch 112) of CPU bus 104. Cache tag memory 108 provides loading on the address bus, system logic controller chip 110 provides loading on the control, data and address buses, and main memory DRAM 114 provides loading on the data bus (through latch 116).

In prior art computer system 100, the system logic chip 110 provides an interface to a system (local) bus 118 having a typical operating frequency of 25 Mhz to 33 Mhz. System bus 118 may be attached to a variety of relatively fast devices 120 (such as graphics, video, communication, or fast disk drive subsystems). System bus 118 can also be connected to a bridge or buffer device 122 for connecting to a general purpose (slower) extension bus 124 (at 4 Mhz to 16 Mhz operating frequency) that may have many peripheral devices (not shown) attached to it.

Traditional high speed cache systems, whether first level or second level, are implemented using static random access memories (SRAMs) because the SRAMs are fast (with access times ranging from 7 to 25 nanoseconds (ns) and cycle times equal to access times). SRAMs are suitable for storing and retrieving data from high-speed microprocessors having bus speeds of 25 to 100 megahertz. Traditional dynamic random access memories (DRAMs), are less expensive than SRAMs on a per bit basis because DRAM has a much smaller cell size. For example, a DRAM cell is typically one quarter of the size of an SRAM cell using comparable lithography rules. DRAMs are generally not considered to be suitable for high speed operation because DRAM accesses inherently require a two-step process having access times ranging from 50 to 120 ns and cycle times ranging from 90 to 200 ns.

Access speed is a relative measurement. That is, while DRAMs are slower than SRAMs, they are much faster than other earlier-era memory devices such as ferrite core and charge-coupled devices (CCD). As a result, DRAM could theoretically be used as a "cache" memory in systems which use these slower memory devices as a "main memory". The operation modes and access methods, however, are different from the operation modes and access methods disclosed herein.

In most computer systems, the second level cache operates in a fixed and rigid mode. That is, any read or write access to the second level cache is of a few constant sizes (line sizes of the first and second level caches) and is usually in a burst sequence of 4 or 8 words (i.e., consecutive reads or writes of 4 or 8 words) or in a single access (i.e., one word). These types of accesses allow standard SRAMs to be modified to allow these SRAMs to meet the timing requirements of very high speed processor buses. One such example is the burst or synchronous SRAM, which incorporates an internal counter and a memory clock to increment an initial access address. External addresses are not required after the first access, thereby allowing the SRAM to operate faster after the first access is performed. The synchronous SRAM may also have special logic to provide preset address sequences, such as Intel's interleaved address sequence. Such performance enhancement, however, does not reduce the cost of using SRAM cells to store memory bits.

Synchronous DRAMs (SDRAM) have adopted similar burst-mode operation. Video RAMs (VRAM) have adopted the serial port operation of dual-port DRAMs. These new DRAMs are still not suitable for second level cache operation, however, because their initial access time and random access cycle time remain much slower than necessary.

It would therefore be desirable to have a structure and method which enables DRAM memory to be used as a second level cache memory.

Prior art computer systems have also included multiple levels of SRAM cache memory integrated on the same chip as the CPU. For example, DEC's Alpha 21164 processor integrates 16 Kbytes of first level SRAM cache memory and 96 Kbytes of second level SRAM memory on the same chip. In such cases, a third level SRAM cache is typically used between the processor and a DRAM main memory. In such a computer system, it would be desirable to use a DRAM memory to replace the third level SRAM cache memory.

Prior art high-performance second level SRAM cache memory devices generally conform to a set of pin and function specifications to assure that system logic controller 110 may operate compatibly with a variety of different SRAM cache memories from multiple suppliers. Several examples of such pin and function specifications are set forth in the following references: "Pentiumm™" Processor 3.3V Pipelined BSRAM Specification", Version 1.2, Intel Corporation, Oct. 5, 1994; "32K×32 CacheRAM™ Pipelined/Flow Through Outputs Burst Counter, & Self-Timed Write—For Pentium™/PowerPC™ Processors", Advance Information IDT71V432, Integrated Device Technology, Inc., May 1994; and "32K×32 CacheRAM™ Burst Counter & Self-Timed Write—For the Pentium™ Processor", Preliminary IDT71420, Integrated Device Technology, Inc., May 1994.

It is therefore desirable to have a method and structure which enables DRAM memory to be used as a second level cache memory which can be interfaced to a conventional logic controller which normally controls a second level SRAM cache memory. It is further desirable to have such a method and structure which requires minimal modification to the conventional logic controller.

SUMMARY OF THE INVENTION

In accordance with the present invention, a structure and method for configuring a DRAM array, or a plurality of DRAM arrays, as a second level cache memory is provided. A structure in accordance with the invention includes a computer system having a central processing unit (CPU), a SRAM cache memory integrated with the CPU, a CPU bus coupled to the CPU, and a second level cache memory comprising a DRAM array coupled to the CPU bus. The second level cache memory is configured as stand alone memory in one embodiment. In another embodiment, the second level cache memory is configured and integrated with system logic on a monolithic integrated circuit (IC). For high pin count microprocessors such as Intel's Pentium, the companion system logic controller may be partitioned into multiple chips (e.g., Intel's 82430 PCI set). In such a system, the second level cache DRAM array of the present invention may be integrated with one of the system logic chips, preferably the system logic chip(s) for the data path. In another configuration, the second level cache memory can be integrated with the CPU itself.

When accessing the DRAM array of the present invention, row access and column decoding operations are performed in a self-timed asynchronous manner. Predetermined sequences of column select operations are then performed, wherein the column select operations are synchronous with respect to a clock signal. This asynchronous-synchronous accessing scheme reduces the access latency of the DRAM array.

In one embodiment, the DRAM array is operated in a dual-edge transfer mode in response to the CPU bus clock signal. Consequently, the DRAM array performs access operations at a frequency which is twice as fast as the frequency of the CPU bus clock signal. DRAM access therefore occurs twice as fast as operations on the CPU bus.

In another embodiment, the second level cache memory includes a phase locked loop (PLL) circuit coupled to the CPU bus. The PLL circuit generates a fast clock signal having a frequency greater than the frequency of a CPU bus clock signal. The fast clock signal is provided to the DRAM array to control read and write operations. In one embodiment, the fast clock signal has a frequency equal to twice the frequency of the CPU bus clock signal. Again, DRAM access occurs twice as fast as the operations on the CPU bus.

In yet another embodiment, the second level cache memory includes a phase locked loop (PLL) circuit coupled to the CPU bus. The PLL circuit generates buffered clock signals at the same frequency as the CPU bus clock signal and may have various phase relationships with respect to the CPU bus clock signal.

Data values can be read from the DRAM array to the CPU bus through a read first in first out (data buffer) memory having a data input port coupled to the DRAM array and a data output port coupled to the CPU bus. The data input port is clocked by the fast clock signal and the data output port is clocked by the CPU bus clock signal. Because data is read out of the DRAM array faster than the data is read out to the CPU bus, additional time is available during which the DRAM array can be precharged. The precharge time is thereby "hidden" from the CPU bus during a read operation from the second level cache memory. Alternatively, the width of the data input port between the DRAM array and the read data buffer can be widened, and the data input port can be clocked by a buffered version of the CPU bus clock signal. This alternative also provides a faster internal data transfer rate between the DRAM array and the read data buffer, thereby providing additional time in which the DRAM array can be precharged.

Data values can also be written from the CPU bus to the DRAM array through a write data buffer memory having a data output port coupled to the DRAM array and a data input port coupled to the CPU bus. The output port of the write data buffer memory is clocked by the fast clock signal and the input port of the write data buffer memory is clocked by the CPU bus clock signal. A first set of data values is written and stored in the write data buffer memory until a second set of data values is written to the write data buffer memory. At this time, the first set of data values is written to the DRAM array at the frequency of the fast clock signal. Because the first set of data values is written to the DRAM array faster than the second set of data values is written to the write data buffer memory, a DRAM precharge operation can be performed during the time the second set of data values is written to the write data buffer memory. Therefore, the DRAM precharge operation is effectively "hidden" from the CPU bus during a write operation to the second level cache memory. Alternatively, the width of the data output port between the write data buffer memory and the DRAM array can be widened, and the data output port can be clocked by a buffered version of the CPU bus clock signal. This alternative also provides a faster internal data transfer rate between the write data buffer memory and the DRAM array, thereby providing additional time in which the DRAM array can be pre charged.

By operating the DRAM array with a faster clock signal or a wider data path than the CPU bus, a DRAM memory array can be used to satisfy the speed and operational requirements of a second level cache memory. Such a DRAM memory array can be used at a lower cost, typically 75% less, than traditional SRAM implementations.

In another embodiment, data values to and from the DRAYI array are routed through a sense amplifier circuit, a data amplifier circuit and a column selector coupled between the sense amplifier circuit and the data amplifier circuit. Writing data values to the DRAM array then involves the steps of (1) opening the column selector to isolate the data amplifier circuit from the sense amplifier circuit, (2) writing the data values from the write data buffer memory to the data amplifier circuit substantially in parallel with performing a row access operation in the DRAM array, and (3) closing the column selector to connect the data amplifier circuit to the sense amplifier circuit, thereby causing the data values to be provided to the DRAM array through the sense amplifier circuit. By writing data values to the write data buffer memory in parallel with the row access operation, more time is available to precharge the DRAM array.

The column selector can also be used during a DRAM read operation to provide additional time for a DRAM precharge operation. To do this, data values are read from the DRAM array to the sense amplifier circuit. The column selector is then closed to connect the sense amplifier circuit to the data amplifier circuit. After the data values have been written to the data amplifier circuit, the column selector is opened, thereby isolating the sense amplifier circuit from the data amplifier circuit. The data values can then be read out of the data amplifiers while the DRAM array is being precharged.

The DRAM cache memory of the present invention operates on a transaction by transaction basis. A transaction is defined as a complete read or write data access cycle for a given address. A transaction can involve the transfer of a single data value, or the burst transfer of 4 data values. A burst transfer can transfer the data values on consecutive clock cycles, every other clock cycle, every third clock cycle, etc. A transaction in the DRAM cache memory must be executed as either a read or a write transaction, but cannot be both. That is, the DRAM cache memory transaction cannot include partial read and partial write transactions, or change from a read transaction into a write transaction before the data transfer begins. In contrast, in standard SRAM, Burst SRAM (BSRAM) or Pipelined Burst SRAM (PBSRAM) memories, a transaction can start as either a read or a write and change into write or read on a clock by clock basis. This is because SRAM accesses, whether with or without input registers or output registers, are directly from and to the memory cell array and the read or write operation can be applied to the memory cells directly.

The transaction-based configuration of the DRAM cache memory of the present invention utilizes control signals to prevent any incorrect or delayed internal operations which might otherwise occur due to the internal two-step access (RAS and CAS) of the DRAM cache memory and the write data buffer used to buffer the write operation. In a preferred embodiment, a CPU-initiated address strobe input signal (ADSP#) and a controller-initiated address strobe input signal (ADSC#) are used to indicate the start of new transactions in a manner compatible with standard PBSRAM. A byte write enable input signal (BWE#) and a global write input signal (GW#) are used as write control signals in a manner compatible with standard PBSRAM. An additional W/R# input signal (which is typically driven by the CPU) is incorporated to enable read and write transactions of the DRAM cache memory to be performed in a well-defined manner.

The DRAM array, unlike the SRAM array, also requires periodic refresh operations to restore the charge in the cell capacitors to guarantee data integrity. To manage the internal refresh operation of the DRAM array without disrupting normal CPU and system controller operations, a handshake (Krdy) signal is required to communicate between the DRAM cache memory and the system controller, so that the latter may delay its own operation and operation of the CPU while the DRAM array is being refreshed. In a preferred embodiment, one signal pin of the DRAM array is used to carry the handshake signal. The single pin maintains maximum compatibility with standard PBSRAM system controllers.

In one embodiment, the falling edge of the Krdy signal indicates there is a pending refresh or other internal operation request, and the rising edge of the Krdy signal indicates the refresh or other internal operation has been completed. The polarity of the Krdy signal is chosen arbitrarily, and opposite polarity can be used to accomplish the same effect. Both the DRAM cache memory and the system controller sample the Krdy signal at least at the beginning of each new transaction, whether the transaction is initiated by the ADSP# or ADSC# signal.

The Krdy signal can be used in different manners. In a preferred embodiment, the Krdy signal is implemented as an input/output signal. When multiple DRAM cache memory devices are used together for memory width or depth expansion or both, the Krdy signal can be used for synchronizing the DRAM refresh and/or internal operation among the multiple devices. Specifically, one of the DRAM cache memory devices is designated as a master device for refresh management. This master DRAM cache memory device uses the Krdy signal to communicate with the system controller and control the refresh management function. Each of the remaining DRAM cache memory devices share the Krdy signal line and are designated as slave devices. Each slave device samples the state of the Krdy signal to control its own refresh or internal operation as appropriate.

In an alternative embodiment, the Krdy signal is driven by the system controller, and each DRAM cache memory, upon detecting a low Krdy signal, will initiate and complete a pre-defined refresh operation.

The present invention will be more fully understood in light of the following detailed description taken together with the drawings.

BRIEF DESCRIPTION OF THE DRAWINGS

FIG. 13 is a schematic diagram illustrating a DRA.M second level cache in a typical system environment with key signal pins, in accordance with an embodiment of the invention;

DETAILED DESCRIPTION OF THE INVENTION

Figure 1:
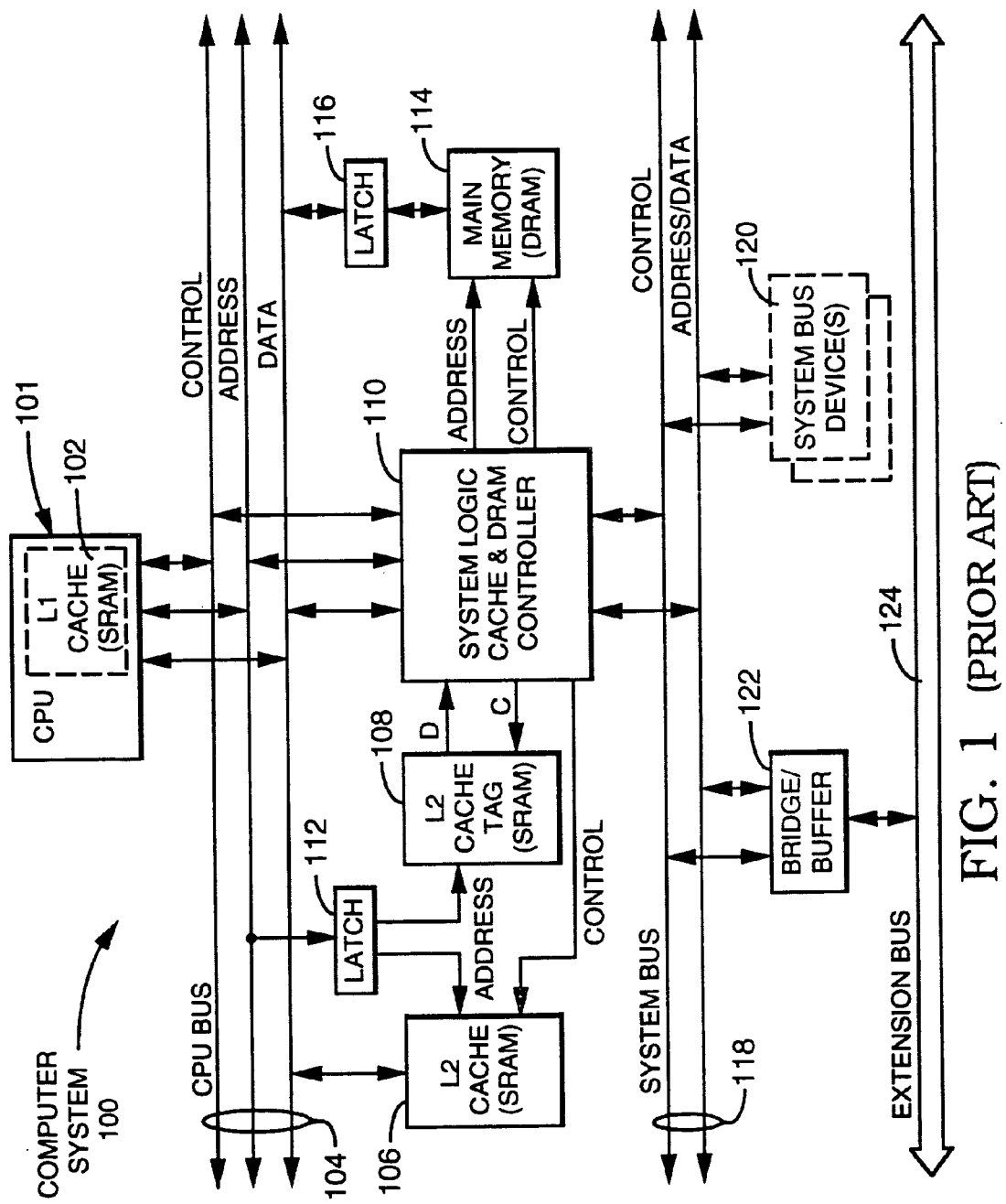
FIG. 1 is a block diagram of a prior art computer system having an SRAM second level cache memory.
Figure 2:
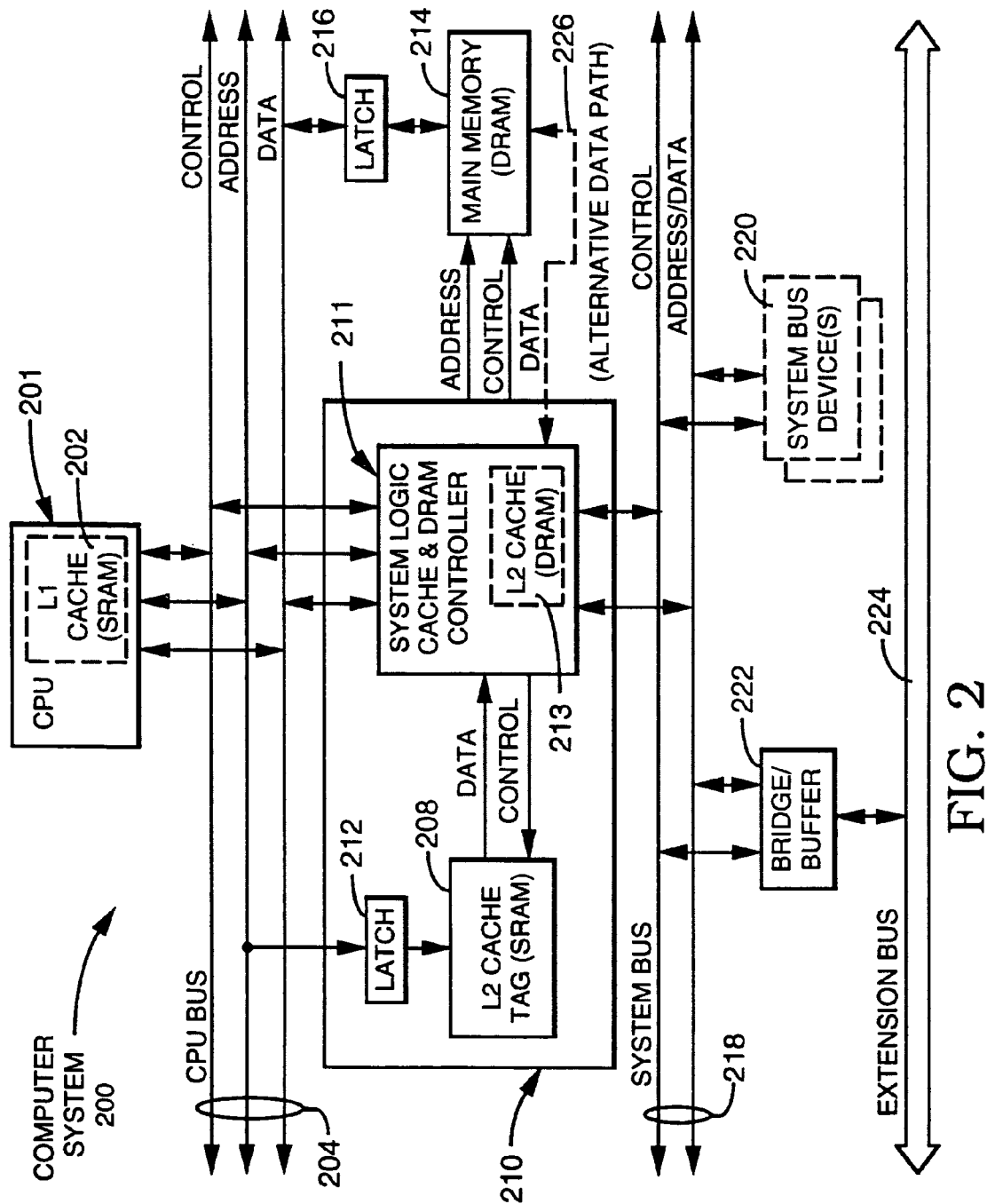
FIG. 2 is a block diagram of a computer system having a DRAM second level cache memory in accordance with the invention.

FIG. 2 is a block diagram of computer system 200 which includes second level DRAM cache memory 213 in accordance with the invention. In addition to second level DRAM cache memory 213, computer system 200 includes CPU 201, first level SRAM cache 202, CPU bus 204, latches 212 and 216, second level SRAM cache tag memory 208, system logic controller 211, main DRAM memory 214, system bus 218, bridge buffer circuit 222, system bus devices 220 and extension bus 224.

Although DRAM cache memory 213 is referred to as a "second level" cache memory, it is understood that the present invention can also be applicable to other "levels" of cache memory higher than the second level (e.g., third level or fourth level). In general, the present invention is applicable to the "next level" cache memory, where the "next level" cache memory is defined as the cache memory which is connected between the processor and a large-capacity main memory (where the main memory is typically DRAM). Using this definition, the term "second level cache memory" is interchangeable with the term "next level cache memory" in the following.

CPU 201, which is typically fabricated on the same integrated circuit chip as first level SRAM cache memory 202, is coupled to the control, address and data lines of the CPU bus 204. Second level SRAM cache tag memory 208 receives address signals from the address lines of CPU bus 204 through latch 212. System logic controller 211 (which controls second level DRAM cache memory 213 and main memory 214) is coupled to the control, address and data lines of CPU bus 204. In one embodiment, main DRAM memory 214 receives data signals from the data lines of CPU bus 204 through latch 216. In another embodiment, main DRAM memory 214 receives data signals from system logic controller 211 through alternate data path 226. System logic controller 211 interacts with cache tag memory 208 and main memory 214 in a conventional manner. In one embodiment, SRAM cache tag memory 208, latch 212, system logic controller 211 and second level cache memory 213 are fabricated on the same integrated circuit chip 210. In another embodiment, second level DRAM cache memory 213 and system logic controller 211 are fabricated on separate chips. In yet another embodiment, second level DRAM cache memory 213 and system logic controller 211 are fabricated on the same chip as CPU 201 and first level SRAM cache memory 202.

Because the data paths from CPU bus 204, SRAM cache tag memory 208, system bus 218 and main memory 214 feed into system logic controller 211, the system logic controller 211 can manage most of the data traffic locally without tying up CPU bus 204. For example, system logic controller 211 controls data traffic between main memory 214 and second level DRAM cache memory 213 or between system bus 218 and main memory 214. Consequently, the loading of CPU bus 204 is lighter and the physical layout of CPU bus 204 is more compact, thereby allowing for faster operations on CPU bus 204.

Embodiments of the present invention overcome many obstacles to successfully use second level DRAM cache memory 213 as a second level cache memory which matches the performance of an SRAM-cell based second level cache. These obstacles include: (1) slow access latency, (2) pre-charge time, (3) refresh arbitration and control. These obstacles are overcome as described below.

Slow Access Latency

The access time of a DRAM cell array consists of a row access (RAS) time (i.e., the time to decode a row address, select a row word-line, and load a row of data bits from the DRAM cell array into sense amplifiers in the column area) and a column access (CAS) latency (i.e., the time to decode a column address, select a column, read the data from the sense amplifiers into data amplifiers, and then propagate the data signal to the chip input/output area). The sum of the row and column access latencies is relatively long (45 to 60 ns) compared to SRAM access latency (7 to 25 ns). The DRAM access is longer because of the two-step sequential access, as well as the relatively long column decoding and access time (17 to 25 ns)

Some prior art DRAM devices such as pseudo-SRAMs and BiCMOS fast DRAM (e.g., Hitachi's 35 ns 1 Mb BiCMOS DRAM with demultiplexed addressing), use an SRAM-like interface in which the full row and column addresses are provided to the chip at one time and internal two-step access is performed in a fully asynchronous fashion. However, these pseudo-SRAM devices combine the RAS and CAS data operations, precharge time and the array refresh operation into each access cycle to emulate standard asynchronous SRAM operations. As a result, these pseudo-SRAM devices are very slow and not suitable for cache memory applications.

The BiCMOS fast DRAM has a fast initial access time because demultiplexed addresses allow row and column addresses to be loaded at the beginning of each access cycle using separate address pins. However, the BiCMOS fast DRAM still operates with the constraints of traditional asynchronous DRAM (i.e., long access cycle times and relatively slow subsequent accesses).

Figure 3A:
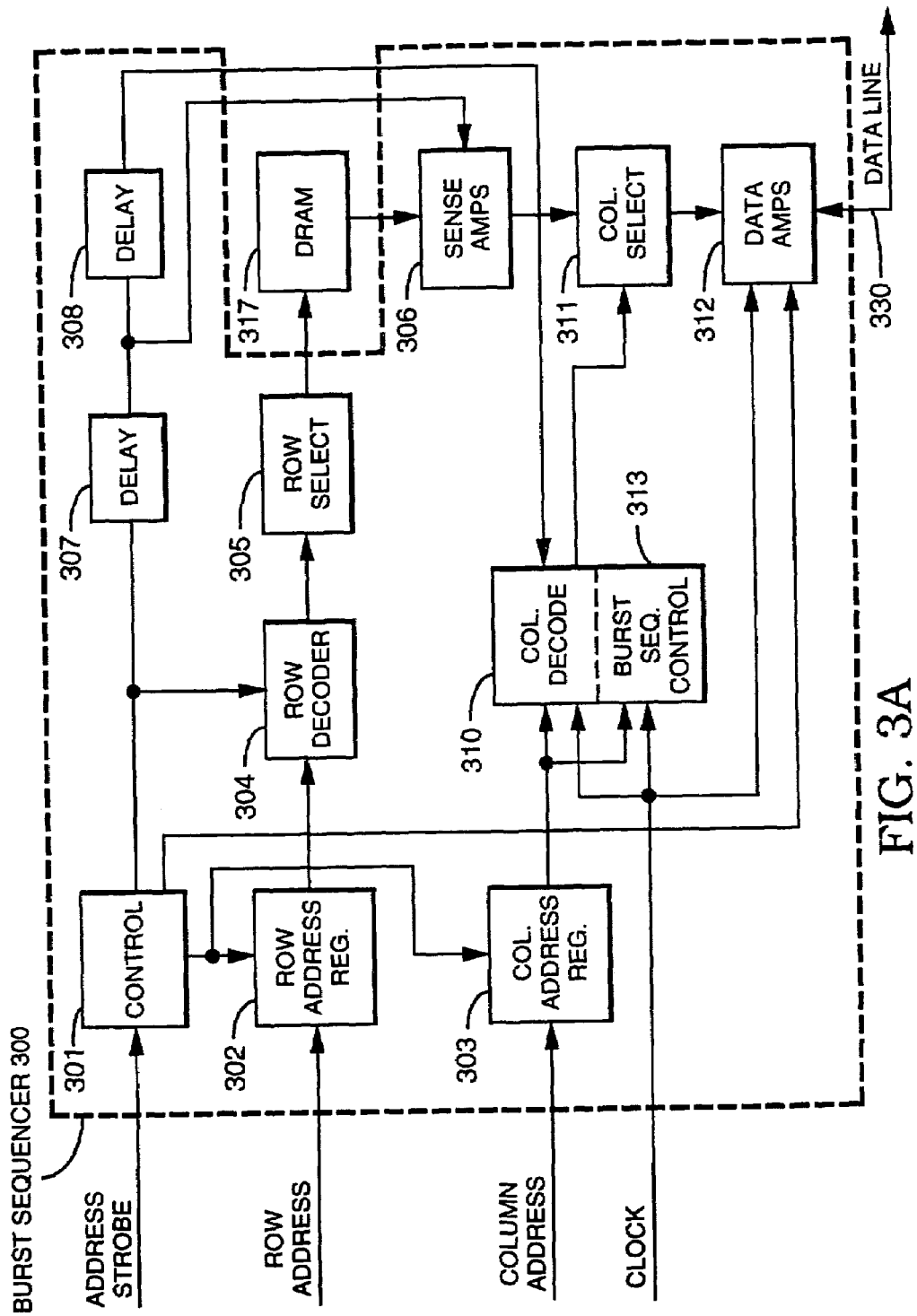
FIGS. 3(a) and 3(b) illustrate a schematic diagram and a timing diagram, respectively, of a self-timed RAS/CAS/burst accessing sequencer.

In one embodiment of the invention, accesses to second level DRAM cache memory 213 are made faster by including a self-timed RAS/CAS/burst sequencer within second level DRAM cache memory 213. The burst sequencer merges asynchronous and synchronous operations of the DRAM accesses in a seamless fashion as described below. FIG. 3a is a block diagram of a self-timed RAS/CAS burst sequencer 300 in accordance with the invention. Burst sequencer 300 represents a Portion of the accessing circuit included within second level DRAM cache memory 213. Burst sequencer 300 includes control circuit 301, row address register 302, column address register 303, row decoder 304, row selector 305, sense amplifier control circuit 306, delay circuits 307-308, sense amplifier circuit 306, column decoder 310, column selector 311, data amplifier circuit 321 and burst sequence controller 313. Burst sequencer 300 is used to access an array of DRAM memory cells 317.

Figure 3B:
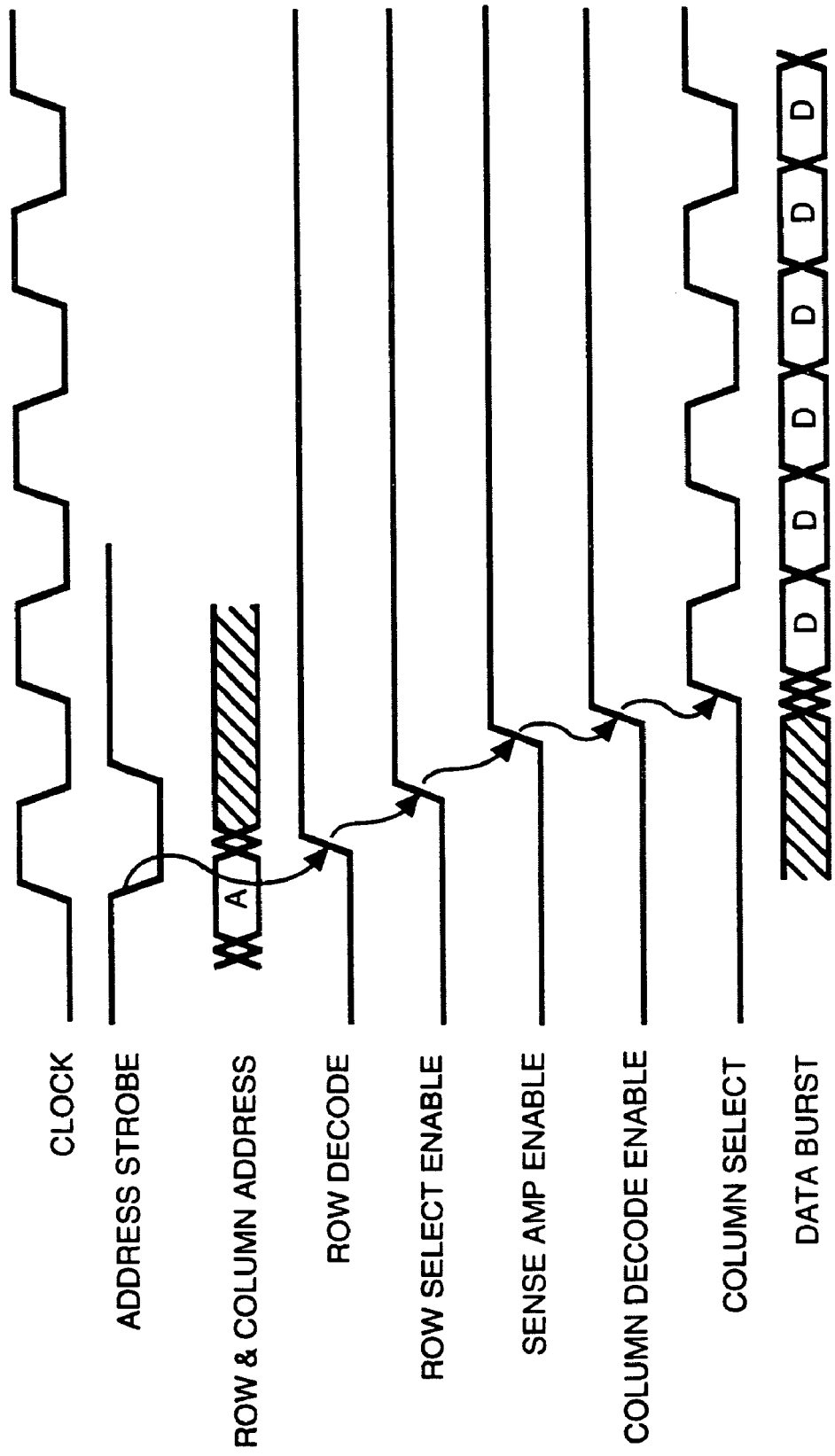

FIG. 3b is a waveform diagram illustrating the operation of burst sequencer 300. To access second level DRAM cache memory 213, CPU 201 transmits a control signal through CPU bus 204 to second level DRAM cache 213. Second level DRAM cache 213 converts this control signal to an address strobe signal (See, e.g., timing control circuit 502, FIG. 5) which is provided to control circuit 301. CPU 201 also transmits an address through CPU bus 204 to second level DRAM cache memory 213. Second level DRAM cache 213 converts this control signal to row and column addresses (See, e.g., address buffer 503, FIG. 5) which are provided to row address register 302 and column address register 303, respectively. In response to the address strobe signal, control circuit 301 generates a signal which causes the full row and column addresses (and bank address, not shown here, to simplify the schematic diagram) to be latched into registers 302 and 303, respectively. It is not necessary to simultaneously latch in the row and column addresses because the column address is not needed until the RAS operation is completed. As long as the column address is latched into register 303 before the completion of the RAS operation, there is no speed penalty.

The row address stored in row address register 302 and a row decode signal (FIG. 3b) generated by control circuit 301 are transmitted to row decoder 304. In response, row decoder 304 decodes the row address and transmits this decoded address to row selector 305. Row selector 305, turns on the appropriate word line (FIG. 3b) (i.e., performs a row selection operation) within DRAM array 317.

A sense amplifier enable signal (FIG. 3b) is then generated by delay circuit 307 and transmitted to sense amplifier circuit 306. In response, the sense amplifiers in sense amplifier circuit 306 turn on to receive the data values of the selected row within DRAM array 317. The asynchronous delay introduced by delay circuit 307 is selected in view of the delays inherent in row decoder 304, row selector 305 and DRAM array 317, such that sense amplifier circuit 306 is enabled as soon as the data values from the selected row of DRAM array 317 are available (i.e., as soon as the row access operation is completed). Delay circuit 307 can be realized in a number of different ways, such as an inverter chain or an RC circuit.

At the same time the row access operation is being performed, the column address can be provided from column address register 303 to column decoder 310, and column decoder 310 can perform the column decode operation. At the same time, burst sequence controller 313 can be set up to supply a special address scrambling sequence based on the initial column address received from column address register 303. For example, Intel's 486 and Pentium microprocessors modula-4 sequences are 0-1-2-3, 1-0-3-2, 2-3-0-1 & 3-2-1-0.

After sense amplifier circuit 306 is turned on and the column decode operation has been performed, the column decoder 310 receives a column decode enable signal from delay circuit 308. This column decode enable signal causes column decoder 310 to provide the decoded column address to the column selector 311. After the initial decoded column address is provided to column selector 311, burst sequence controller 313 causes column decoder 310 to sequentially change the decoded column address provided to the column selector 311 once during each half clock cycle. As a result, sequential data (with appropriate burst sequence scrambling determined by burst sequence controller 313) are read into data amplifiers 312 synchronous to the clock signal. In one embodiment, the clock signal is the CPU bus clock signal (i.e., a buffered copy of the clock signal provided by CPU bus 204).

The clock signal is also provided to data amplifier circuit 312. Data is read from data amplifier circuit 312 to data line 330 at both the rising and falling edges of the clock signal (i.e., dual edge transfer). In this specification, when an operation is said to occur "at a clock edge", it is understood that the operation occurs immediately after the occurrence of the clock edge.

A burst mode write operation is very similar to the read operation, except that data is coming from the chip input/output circuitry and is synchronously loaded into data amplifiers 312 and through column selector 311 into the appropriate sense amplifiers 306 with appropriate burst address sequence. The asynchronous self-timed RAS and CAS operations allow very tight access timing independent of clock frequency (that is, the RAS and CAS access time is constant and not a function of the clock frequency) while at the same time employing fully synchronous operation for the burst read/write operation that scales with clock frequency.

Figure 4:
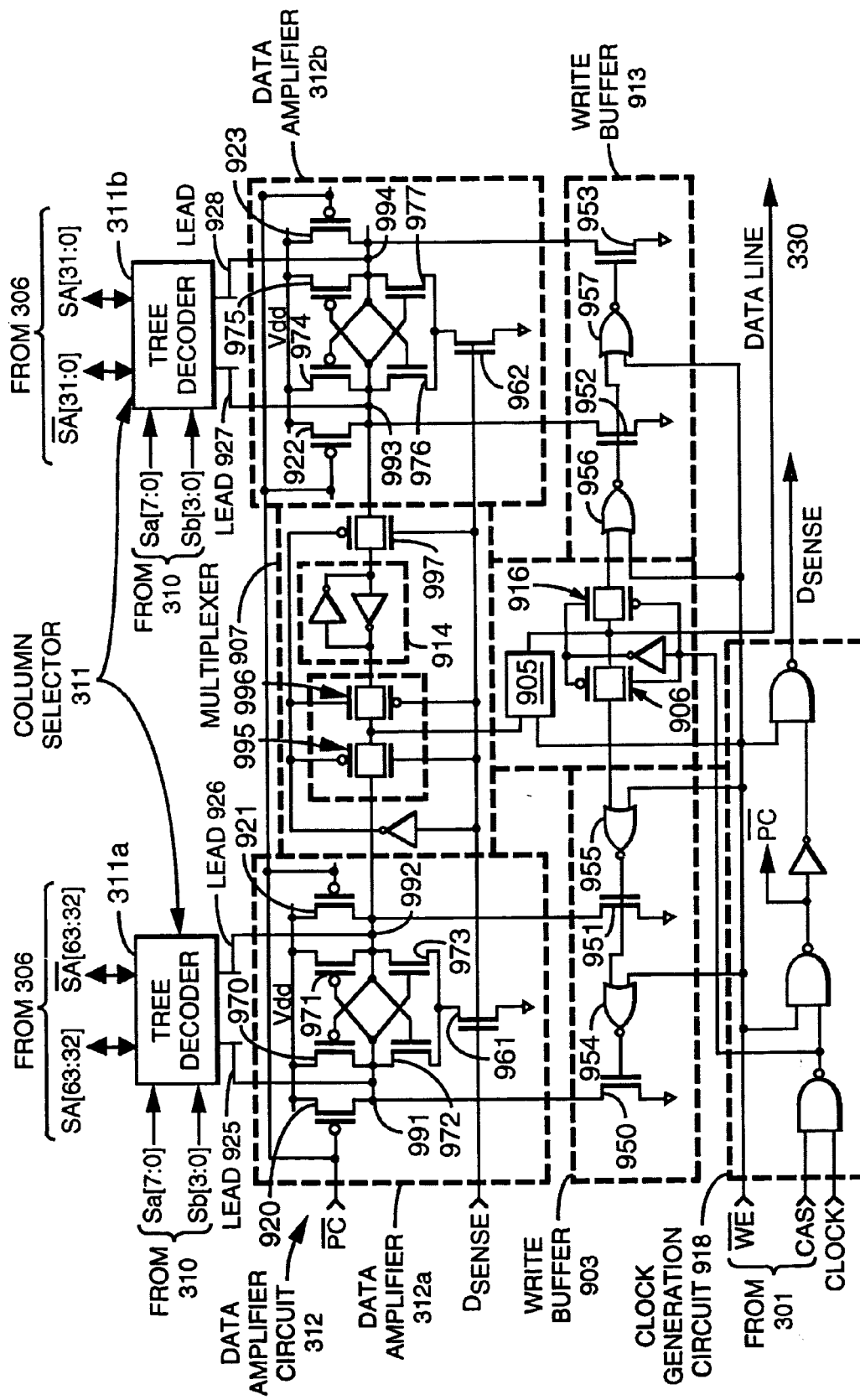
FIG. 4 is a schematic diagram of a fast column accessing circuit.

FIG. 4 is a schematic diagram of a portion of column selector 311 and data amplifier circuit 312 of FIG. 3a. The following discussion describes the manner in which the circuitry of FIG. 4 provides for dual-edge data transfer.

Column selector 311 includes tree decoders 311a and 311b. Tree decoders 311a and 311b are coupled to sense amplifier circuit 306 through a predetermined number (e.g., 32) of complementary signal lines. Tree decoders 311a and 311b are also coupled to column decoder 310. In the embodiment illustrated, column decoder 310 provides control signals Sa[7:0] and Sb[3:0], which cause tree decoders 311a and 311b to selectively couple one of the sense amplifiers in sense amplifier circuit 306 to data amplifier circuit 312.

Data amplifier circuit 312 includes data amplifiers 312a and 312b, multiplexer 907, read data latch 914, write buffers 903 and 913, tri-state buffer 905 and clock generation circuit 918. The circuitry illustrated in FIG. 4 services 64 of the sense amplifiers in sense amplifier circuit 306. The circuitry of FIG. 4 is repeated for each additional 64 sense amplifiers in sense amplifier circuit 306. In one embodiment, the total number of data amplifiers in data amplifier circuit 312 is equal to the number of bits in each data word read from or written to DRAM array 317.

The complementary outputs of tree decoders 311a and 311b are provided to data amplifiers 312a and 312b, respectively. Data amplifiers 312a and 312b are regenerative latches which include cross-coupled transistors 970–973 and transistors 974–977. These regenerative latches are controlled by a locally generated, single phase clock signal $D_{sense}$.

A local self-timed clock circuit 918 generates the control signals used to control data amplifiers 312a and 312b and multiplexer 907. A column precharge signal, $\overline{PC}$, and the $D_{sense}$ signal are generated in response to the clock signal, a column-access (CAS) signal and a bus precharge signal, $\overline{WE}$ (for write operation). The CAS and $\overline{WE}$ signals are generated by control circuit 301. The clock signal is the same clock signal illustrated and described in connection with FIGS. 3a and 3b. The $\overline{PC}$ and $D_{sense}$ signals are local signals which are not used to drive any circuitry outside data amplifier pair 312a and 312b. Thus, timing skew in the control signals is minimized.

Read Operation

To perform a read operation, the $\overline{WE}$ signal is deasserted high. As a result, transistors 950–953 of write buffers 903 and 913 are turned off and tri-state buffer 305 is placed in a low impedance state. The CAS signal is asserted high. During a first half cycle of the clock signal, the clock signal is in a logic high state, thereby forcing both the $D_{sense}$ and $\overline{PC}$ signals to a logic high state. Under these conditions, the complementary outputs of tree decoders 311a and 311b are latched in data amplifiers 312a and 312b, respectively.

For example, a logic low signal on lead 925 and a logic high signal on lead 926 cause transistors 971 and 972 to turn on and transistors 970 and 973 to turn off. The high $D_{sense}$ signal causes transistor 961 to turn on. As a result, node 991 is pulled down to ground through transistors 972 and 961 and node 992 is pulled up to Vdd through transistor 971. In a similar manner, a logic low signal on lead 926 and logic high signal on lead 925 results in node 992 being pulled to ground through transistors 973 and 961 and node 991 being pulled to Vdd through transistor 970.

Data amplifier 312b operates in the same manner as data amplifier 312a to latch the signals present on leads 927 and 928. Thus, a logic high signal on lead 927 and logic low signal on lead 928 results in node 993 being pulled up to Vdd through transistor 974 and node 994 being pulled down to ground through transistors 977 and 962. Similarly; a logic low signal on lead 927 and logic high signal on lead 928 results in node 993 being pulled to ground through transistor 976 and 962 and node 994 being pulled to Vdd through transistor 975.

Within multiplexer 907, the high $D_{sense}$ signal causes transmission gates 995 and 997 to close (i.e., be placed in a conducting state) and transmission gate 996 to open (i.e., be placed in a non-conducting state). As a result, the voltage on node 992 is transmitted through transmission gate 995 and tri-state buffer 905 to data line 330. Data line 330 connects tri-state buffer 905 directly to the bus transceivers in the input/output circuit. This connection results in little loading other than the routing capacitance because there is no other signal multiplexed on this line. Loading of data line 330 is thus substantially smaller than that present in prior art schemes. Consequently, the data lines of the present invention are capable of operating at much higher frequency {up to 250 Mhz).

In addition, the voltage on node 933 is transmitted through transmission gate 997 and is stored in read data latch 914.

During the second half cycle of the clock signal, the clock signal transitions low, thereby forcing both the $D_{sense}$ and $\overline{PC}$, signals low. In response to the low $\overline{PC}$, signal, transistors 920–923 are turned on. As a result, leads 925–928 are coupled to Vdd (i.e., leads 925–928 are precharged). In addition, the low $D_{sense}$ signal opens transmission gates 995 and 997 and closes transmission gate 996. As a result, the voltage stored in read data latch 914 is read out through transmission gate 996 and tri-state buffer 905 to data line 330 during the second half cycle. In the foregoing manner, dual-edge transfer of data from sense amplifier circuit 306 to data line 330 is facilitated.

Write Operation

To perform a write operation, the $\overline{WE}$ signal is asserted low, thereby placing tri-state buffer 905 in a high-impedance state and applying a logic low signal to an input of each of NOR gates 954–957 in write buffers 903 and 913. During a first half cycle of the clock signal, the clock signal is in a logic low state, thereby closing transmission gate 906 and opening transmission gate 916. The signal on the data line 330 is therefore routed to an input of NOR gate 955. For example, a high signal on the data line 330 causes NOR gate 955 to provide a logic low signal to transistor 951, thereby turning off this transistor. The low output of NOR gate 954 is also provided to an input of NOR gate 954, causing NOR gate 954 to output a logic high signal which turns on transistor 950.

The low $\overline{WE}$ signal also causes the $D_{sense}$ and $\overline{PC}$ signals to go high, thereby turning off p-channel transistors 961–962. As a result, p-channel transistor 971 and n-channel transistor 972 are turned on. Consequently, tree decoder 311a receives supply voltage Vdd on lead 926 and the ground supply voltage on lead 925, thereby writing a high data value to the selected column of sense amplifier.

If the input from data line 330 is a logic low signal (as opposed to a logic high signal as previously discussed), tree decoder 311a receives ground supply voltage on lead 926 and supply voltage Vdd on lead 925 in a manner similar to that previously described. In this manner, data is written from data line 330 to the sense amplifiers during each half cycle of the clock signal. The demultiplexing performed by transmission gates 906 and 916 is necessary because the address selected by tree decoders 311a and 311b changes only once every clock cycle.

Tree decoders 311a and 311b limit the multiplexing loading to approximately 12 lines (8+4) (as opposed to 512 lines in a typical conventional scheme). The decreased capacitive loading together with the higher drive signal provided by data amplifier circuit increase the data bandwidth.

Delay Matching

Delay matching in the column circuitry is minimized by routing the lines carrying the clock signal, the pre-decoded column select signals Sa[7:0] and Sb[3:0], and the data signals in the same manner through the column area of the memory array.

Alternate Embodiment

Figure 5:
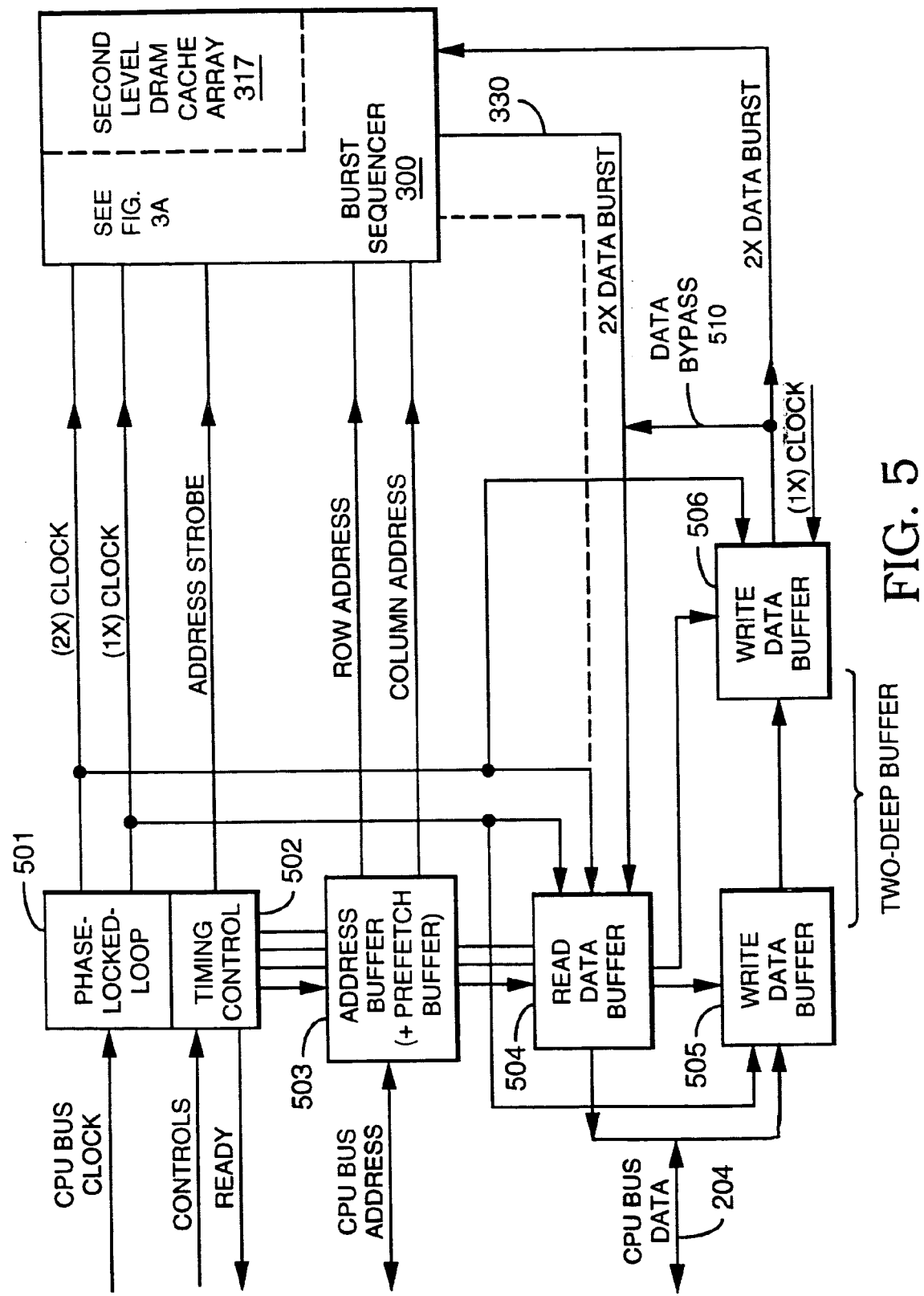
FIG. 5 is a schematic diagram of circuitry which provides for operation of a DRAM second level cache memory at twice the frequency of the CPU bus clock.

FIG. 5 illustrates an alternate embodiment, in which the frequency of the clock signal is doubled and the clock generation circuit 918 (FIG. 4) is modified such that data values are read from (or written to) data amplifier circuit 312 at each rising (or falling) edge of the clock signal. Thus, data values are transferred on data line 330 at the same rate as the previously described embodiment (i.e., at a frequency equal to twice the CPU bus clock frequency). The clock generation circuit 918 can be modified by transmitting the doubled clock signal through a 1-bit counter (not shown) before the clock signal is applied to clock generation circuit 918. Other modifications to clock generation circuit 918 to allow the circuitry of FIG. 4 to operate in a single edge transfer mode with respect to the doubled clock signal would be apparent to one of ordinary skill.

Phase-locked loop (PLL) circuit 501 buffers the CPU bus clock signal (from CPU bus 204, FIG. 2) and generates a clock signal having the same frequency as the CPU bus clock signal (hereinafter referred to as a 1X clock signal) and a clock signal having twice the frequency of the CPU bus clock signal (hereinafter referred to as a 2X clock signal). The 1X and 2X clock signals have fixed phase relationships with respect to the incoming CPU bus clock signal. These phase relationships are selected to provide data set-up and hold times appropriate for proper data transfer.

Address buffer 503 latches the CPU bus address and decodes it into row and column addresses (and a bank address if there are multiple DRAM arrays, not shown here for purposes of simplicity). Timing control circuit 502 derives an internal address strobe signal from the CPU bus address (received from address buffer 503) and a control signal received from CPU bus 204.

The address strobe, row address, column address and 2X clock signals are provided to burst sequencer 300 and DRAY array 317. Burst sequencer 300 and DRAM array 317 operate substantially as previously described in response to these signals (See, FIG. 3a).

Address buffer 503 may have additional latches (pre-fetch buffers) to store the address of the next access operation while the current access is still in progress. The pre-fetch buffers enable pipelined operation so that back to back operations may be partially overlapped to reduce the latency cycles between operations.

The remainder of the circuitry illustrated in FIG. 5 is directed toward solving the problems introduced by the precharge time required for the DRAM array. Accordingly, this circuitry is discussed below.

Precharge Time

The operation of a DRAM cell array requires that after a normal read or write access (RAS+CAS access) the selected row be de-selected and the sense-amplifiers be turned off and equalized before any subsequent RAS operations are initiated. This operation is referred to as a precharge operation. The time period required to perform the precharge operation is referred to as the precharge (PRE) time. The PRE time is sufficiently long to fully equalize the sense amplifiers and the relatively high capacitance bitlines, so that the very small signal provided by the cell capacitor to the sense amplifier in connection with the next RAS operation can be read correctly and reliably. The PRE time requirement prevents DRAMs from executing back to back accesses which SRAMs can easily support. Thus, the access cycle time of DRAM is much longer (typically 1.5X to 2X) than its access latency, while SRAM's access cycle time is approximately equal to its access latency.

To be able to use DRAM with SRAM performance, the PRE time must be substantially "hidden" from the access operations of the CPU bus. Read data buffer 504, write data buffer 505 and write data buffer 506, illustrated in FIG. 5, operate to allow the PRE time to be hidden from the access operations.

As described in more detail below, the 2x clock signal is used to clock DRAM array 317, the data input terminal of read data buffer 504, and the data output terminal of write data buffer 506. The 1X clock signal is used to clock the data output terminal of read data buffer 504 and the data input terminal of write data buffer 505.

Data values are read from DRAM array 317 to CPU bus 204 through read data buffer 504. Data values are read into read data buffer 504 at the frequency of the 2X clock signal. Data is then read out of read data buffer 504 at the frequency of the CPU bus clock signal. In this manner, read data buffer 504 performs clock resynchronization.

Conversely, data values are written to DRAM array 317 from CPU bus 204 through write data buffer 505 and write data buffer 506. Data values are read into write data butter 505 at the frequency of the CPU clock signal and read out of write data buffer 506 at the frequency of the 2X clock signal.

To minimize~ clock-to-data skew, DRAM array 317 can alternatively provide a 2X clock signal to read data buffer 534 along with the data in a source-synchronous fashion. The alternative 2X clock signal is a return clock signal which travels along a path which is selected such that the 2X clock signal exiting DRAM array 317 has a preselected delay and phase relationship with respect to the data values exiting DRAM array 317.

Figure 6:
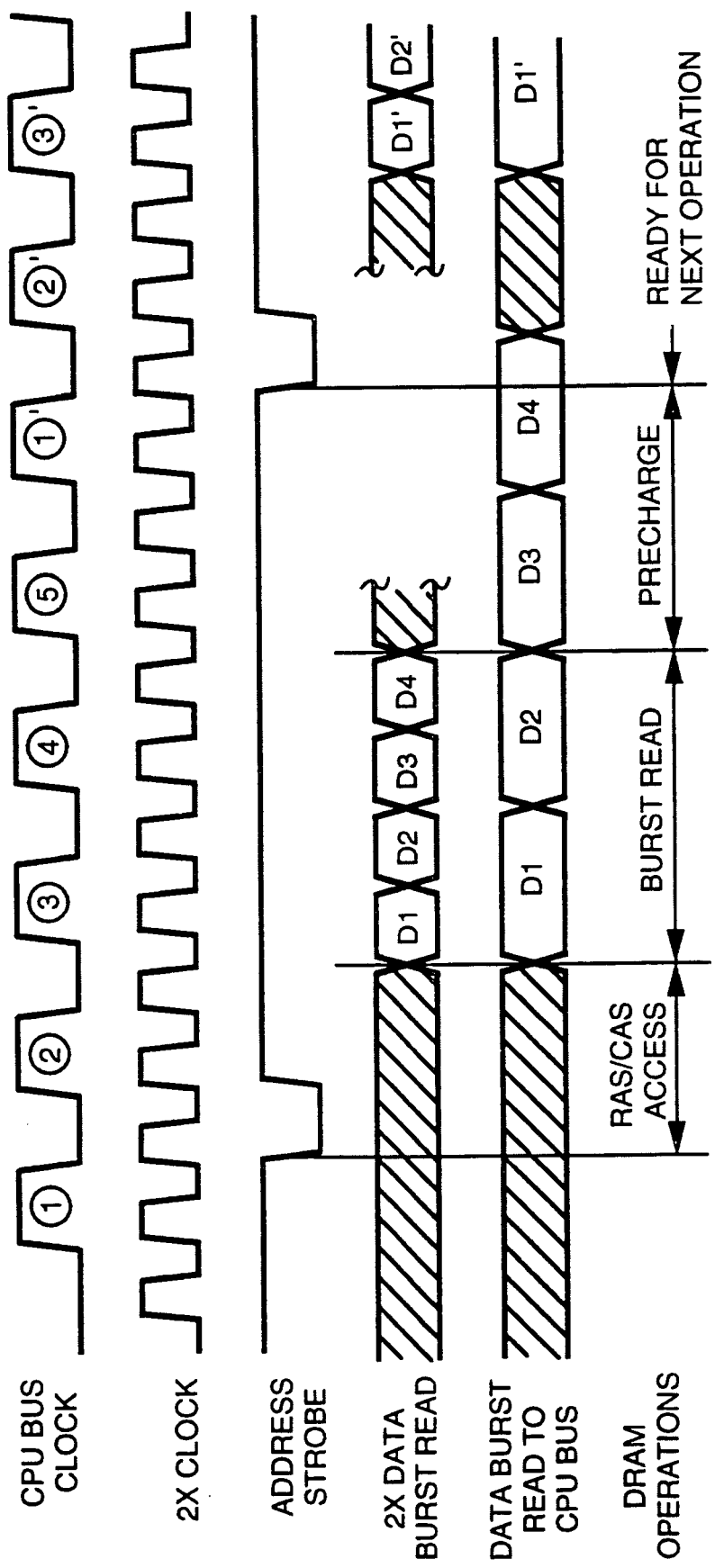
FIG. 6 is a timing diagram of a 2-1-1-1 DRAM second level cache read operation.

FIG. 6 is a timing diagram for a 2-1-1-1 data read burst operation performed by the circuitry of FIG. 5. After the address strobe signal is asserted low, the RAS and CAS operations are initiated in a self-timed, asynchronous fashion (See, FIGS. 3a and 3b). Two rising clock edges after the address strobe signal is asserted, the RAS and CAS operations are completed and a burst read operation is performed by DRAM array 317 in a fully synchronous fashion with respect to the 2X clock signal. The read burst data from DRAM array 317 is clocked into read data buffer 504 by the 2X clock signal. The read burst data is clocked out of read data buffer 504 to the CPU bus by the 1X clock signal. As soon as the read data burst is completed, a precharge operation is initiated to DRAM array 317, thereby preparing DRAM array 317 for the next operation. This next operation can be either a normal back-to-back access or a pipelined access. Because the read data burst is written to read data buffer 504 by the 2X clock signal, there is time left to perform the precharge operation before the data is read out of read data buffer 504 by the 1X clock signal. Thus, the precharge time is hidden from CPU bus 204. If the precharge time is short enough, DRAM array 317 may be ready for a subsequent operation at a time which would allow for pipelined operation.

Figure 7:
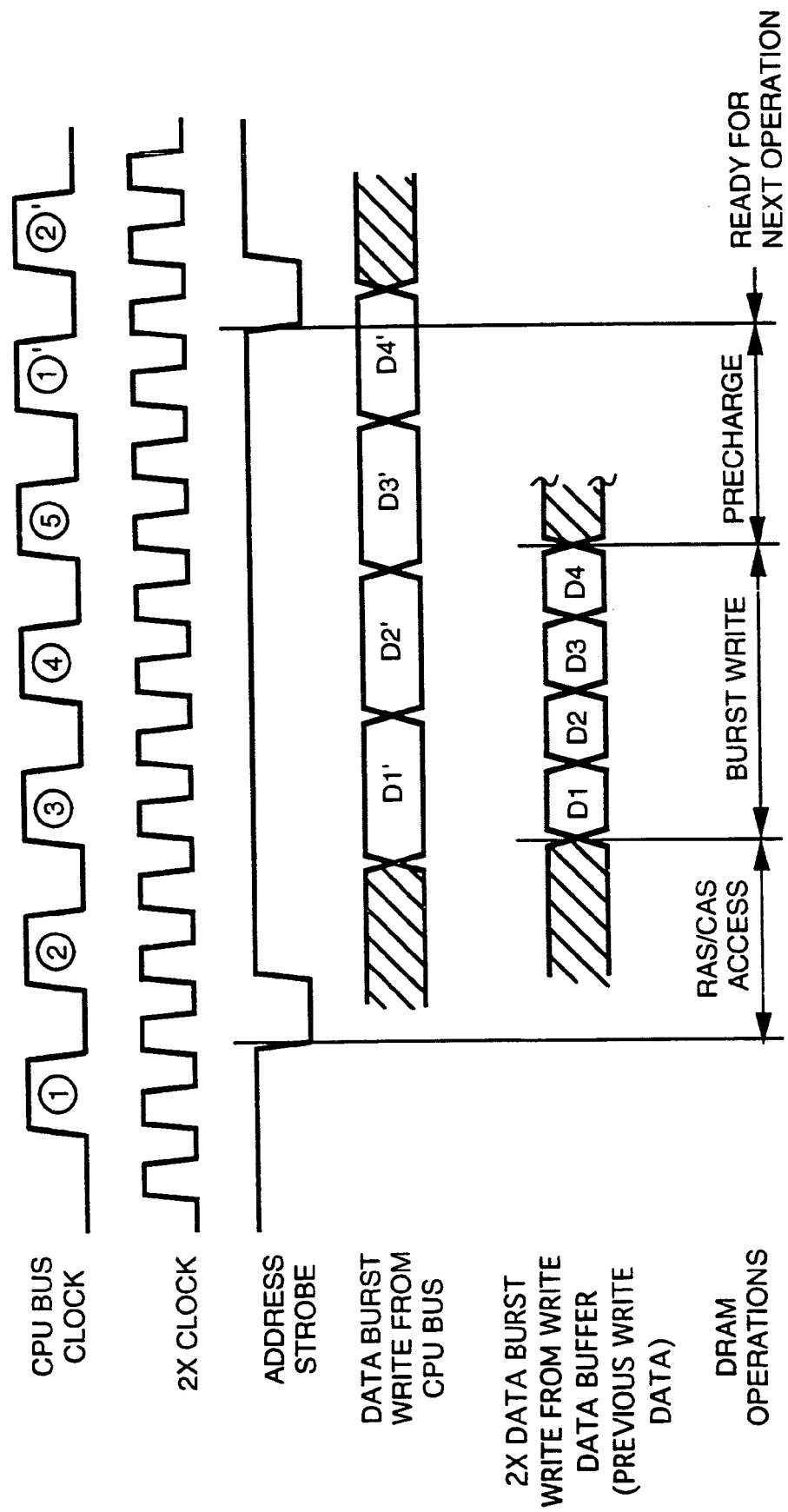
FIG. 7 is a timing diagram of a 2-1-1-1 DRAM second level cache write operation.

FIG. 7 is a waveform diagram illustrating the timing diagram for a 2-1-1-1 data write burst operation. Because the data lines of the CPU bus 204 receive write burst data at a rate equal to the frequency of the CPU bus clock signal (i.e., the frequency of the 1X clock signal,) a full write burst is not completed until the end of the 5th clock cycle. Thus, no time remains in a 2-1-1-1 data write burst operation to perform a precharge operation.

Therefore, a separate write data buffer 505 (FIG. 5) is used to latch in a first group of write burst data values (e.g., D1–D4) from CPU bus 204. When a second group of write burst data values (e.g., D1'–D4') arrives from CPU bus 204 (there may be multiple intervening read bursts), the first group of write burst data values D1–D4 is forwarded to DRAM array 317 through write data buffer 506. The second group of write burst data values D1'–D4' is then stored in write data buffer 505. The address strobe signal initiates the RAS and CAS operations in a self-timed, asynchronous fashion (See, e.g., FIGS. 3a and 3b). The first group of write burst data values D1–D4 is clocked from write data buffer 506 by the 2X clock signal in a fully synchronous fashion. A precharge operation is initiated after the data values D1–D4 are written to DRAM array 317. Because the write data burst is written to DRAM array 317 by the 2X clock signal, there is time left to perform the precharge operation before data values D1'–D4' are written to write data buffer 505 by the 1X clock signal. Thus, the precharge time is hidden from CPU bus 204. Again, if the precharge time is short enough, DRAM array 317 may be ready for a subsequent operation at a time which would allow for pipe lined operation.

FIG. 5 also illustrates a data bypass path 510 from write data buffer 506 to read data buffer 504. Data bypass path 510 allows for the special case where a CPU bus 204 requires access to a group of write burst data stored in write data buffer 505 or write data buffer 506, but not yet sent to DRAM array 317. In this case, the write burst data is transmitted from write data buffer 506 to read data buffer 504 at the same time that the write burst data is sent from write data buffer 506 to DRAM array 317.

In alternate embodiments, additional write data buffers can be connected between write data buffer 505 and CPU bus 204 to add depth to the multi-depth write data buffer created by write data buffer 505 and write data buffer 506.

Older microprocessors (i.e., CPU's) may not support the write data burst access to second level DRAM cache memory 213. In these microprocessors, single write accesses are individually transmitted. However, write data buffer 505 and write data buffer 506 can still operate as previously described to "hide" the precharge time of DRAM array 317.

In another embodiment, read data buffer 504, write data buffer 505 and write data buffer 506 can be used in conjunction with the circuitry illustrated in FIGS. 3a and 4. As previously discussed, this circuitry causes data to be transferred on data line 330 at both the rising and falling edges of the 1X clock signal (i.e., dual-edge transfer). When performing dual-edge transfer with the 1X clock signal, PLL 501 is not necessary because the two edges of the incoming CPU bus clock signal provide the necessary timing references used for data transfer. In such an embodiment, the input port of read data buffer 504 and the output port of write data buffer 506 are modified such that they are clocked by both the rising and falling edges of the 1X clock signal.

In yet other embodiments, the burst methods previously described can be performed at other clock frequencies (e.g., 4X clock frequency), depending on the timing requirements of DRAM array 317.

The precharge time of DRAM array 317 (FIG. 2) can alternatively be hidden using tree decoders 311a and 311b (FIG. 4) of column selector 311 (FIG. 3a) as isolation switches between sense amplifier circuit 306 and data amplifier circuit 312. To electrically isolate data amplifier circuit 312 from sense amplifier circuit 306, a disconnect control signal is provided to column decoder 310. In response, column decoder 310 disables all control signals Sa[7:0] and Sb[3:0] such that all of the switches in tree decoders 311a and 311b (FIG. 4) are opened, thereby isolating data amplifiers 312a and 312b from sense amplifiers SA[63:0] and $\overline{SA}$[63:0]. The switches of column selector 311 are opened as soon as the data amplifiers in data amplifier circuit 312 have settled. The precharge operation can be initiated as soon as data amplifier circuit 312 and sense amplifier circuit 306 are isolated.

Figure 8:
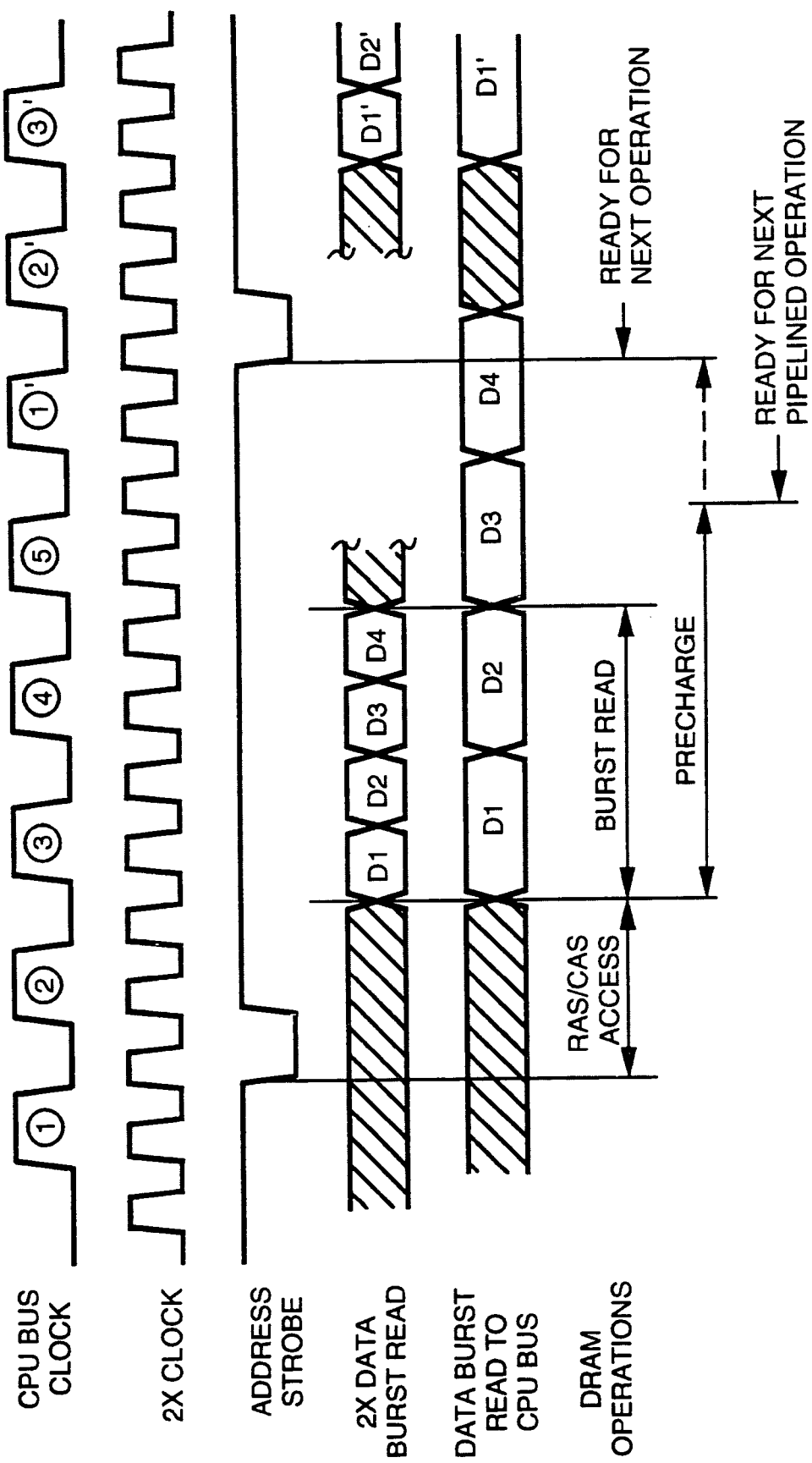
FIG. 8 is a timing diagram of a 2-1-1-1 DRAM second level cache read operation in accordance with an alternate embodiment of the invention.

FIG. 8 illustrates the timing of a read burst operation in accordance with this embodiment of the invention. Isolation occurs after the RAS/CAS access operations are performed. Thus, the burst read and precharge operations can be performed simultaneously. Although FIG. 8 indicates that the burst read operation is performed at the frequency of the 2X clock signal, the burst read operation can also be performed at the frequency of the 1X clock signal because the burst read operation can be performed at the same time as the precharge operation. Performing the burst read operation at the frequency of the 1X clock signal advantageously reduces read errors and power consumption.

Once the data amplifier circuit 312 is disconnected from the sense amplifier circuit 306, data values can only be accessed from data amplifier circuit 312. Consequently, to support a burst access, the number of data amplifiers in data amplifier circuit 312 must be sufficient to store all of the data values required during the burst access. Thus, to support a burst access of 4 words, there must be enough data amplifiers in data amplifier circuit 312 to simultaneously store all of the bits which make up the 4 words. In such an embodiment, multiple sense amplifier data values are read into multiple data amplifiers simultaneously by using multiple data amplifiers. This is in contrast to the previously described embodiments in which data amplifier circuit 312 only needs to have a data amplifier for each of the bits in a single word.

In a variation of the embodiment which uses column selector 310 as an isolation switch, multiple DRAM arrays can be simultaneously accessed to provide a burst access. Thus, four DRAM arrays can be used to provide a burst access of 4 words. To accomplish this, a data word is simultaneously stored in the data amplifier circuit of each of the four DRAM arrays. The data amplifier circuits of these DRAM arrays are then disconnected from their associated sense amplifier circuits. The four words can then be read from the data amplifier circuits of the DRAM arrays in the desired order while the DRAM arrays are simultaneously being precharged.

Figure 9:
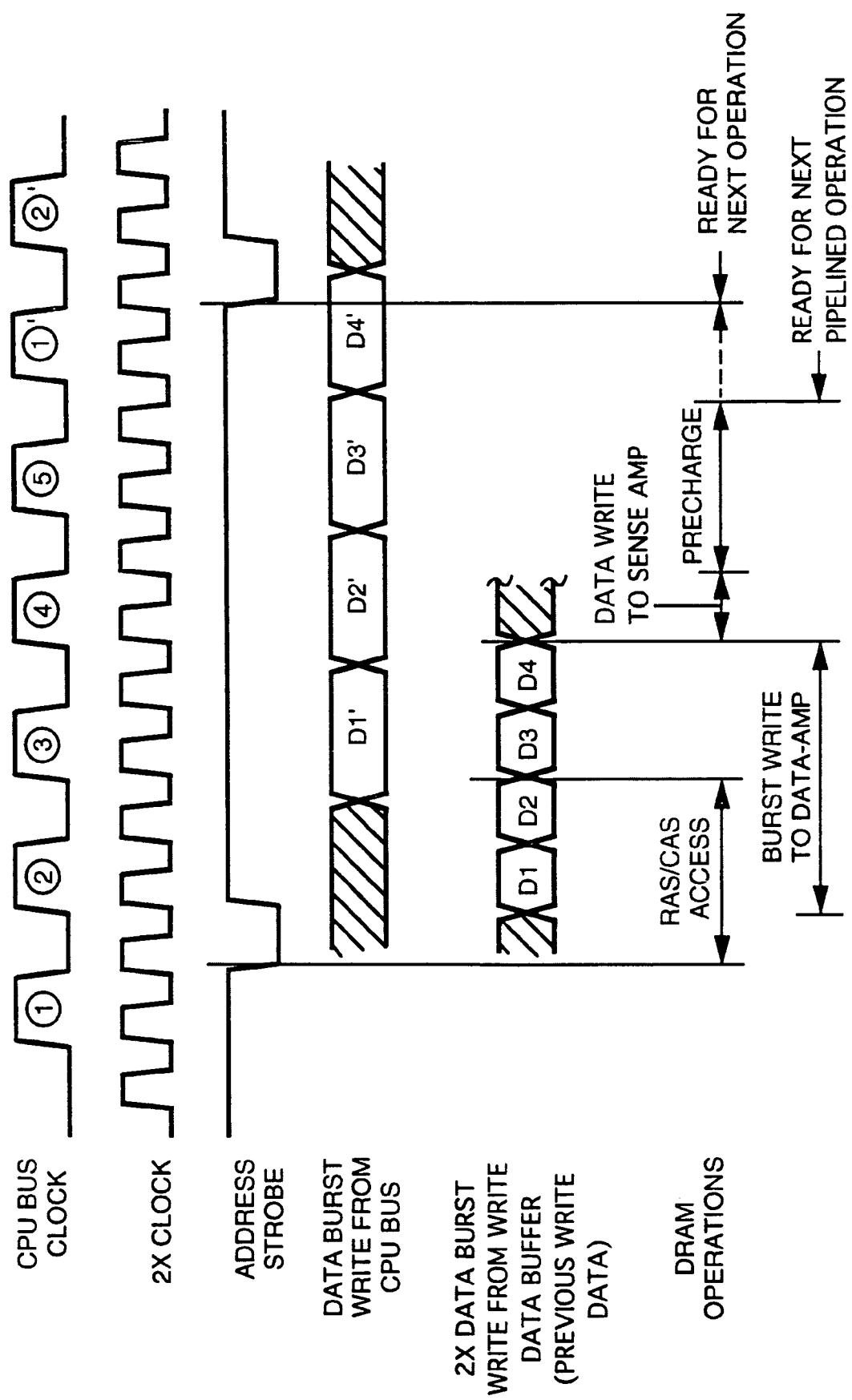
FIG. 9 is a timing diagram of a 2-1-1-1 DRAM second level cache write operation in accordance with an alternate embodiment of the invention.

FIG. 9 illustrates the timing of a write burst operation in accordance with this embodiment of the invention. Write data buffer 505 stores a first group of write burst data values D1–D4. Upon receiving a second group of write burst data values D1'–D4', data amplifier circuit 312 is isolated from the sense amplifier circuit 306 and the first group of write burst data values D1–D4 is transmitted through write data buffer 505 to data amplifier circuit 312 at the frequency of the 2X clock signal. At the same time, the RAS/CAS access operations are performed. After the RAS/CAS access operations are complete, data amplifier circuit 312 is connected to sense amplifier circuit 306, thereby providing the first group of write burst data values D1–D4 to sense amplifier circuit 306. The precharge operation is then initiated. Because the write data is burst at the frequency of the 2K clock signal, more time is provided to perform the precharge operation. As a result, the precharge operation can be performed before a subsequent write burst operation is to be performed with the second group of write burst data values D1'–D4'.

Figure 10:
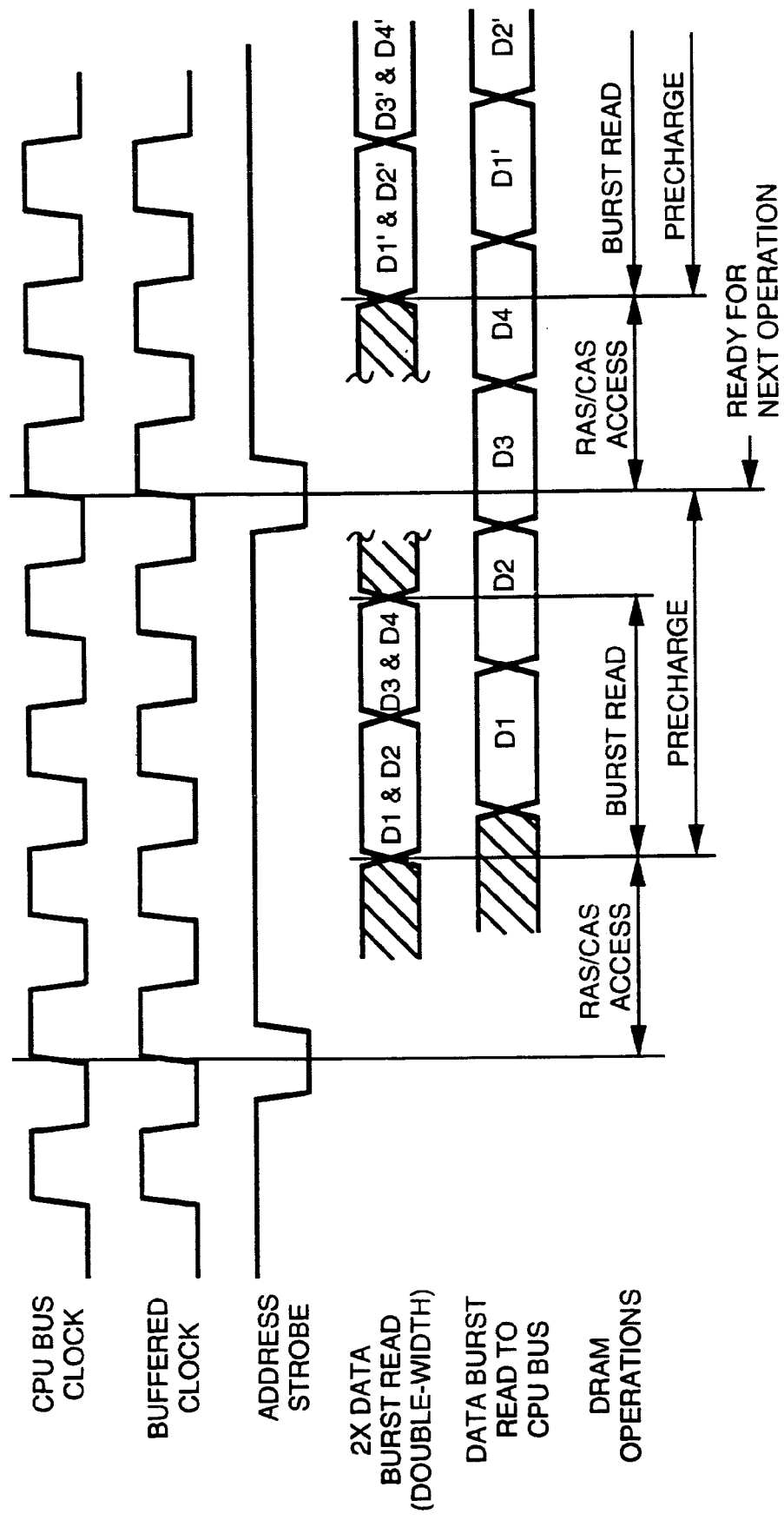
FIG. 10 is a timing diagram of a 3-1-1-1 DRAM second level cache read operation in accordance with an embodiment of the invention.

In yet another embodiment, the data path between DRAM array 317 and read data buffer 504 is widened. FIG. 10 is a timing diagram of a 3-1-1-1 DRAM second level cache read operation in accordance with this embodiment of the invention. In this embodiment, the 1X clock signal (generated with or without PLL circuit 501) is used to launch operations within DRAM array 317. A double-wide internal data path, which simultaneously carries two data values, is provided between DRAM array 317 and read data buffer 504, effectively doubling the data transfer rate between DRAM array 317 and read data buffer 504. Although FIG. 10 illustrates a double-wide internal data path, data paths having other widths (e.g., triple-wide, quadruple wide, etc.) are possible and within-the scope of the invention. The RAS and CAS operations are launched after the address strobe signal (indicating a new transaction) is asserted. As soon as the accessed data values (e.g., D1–D4) are read from DRAM array 317 into data amplifier circuit 312 (FIG. 3a), column selector 310 disconnects sense amplifier circuit 306 from data amplifier circuit 312 and the precharge operation is begun. This allows DRAM array 317 to operate with a minimum cycle time.

The burst data values D1–D4 are transmitted over the internal data path at the rate of two data values for each cycle of the 1X clock signal. Thus, data values D1 and D2 are transmitted during one clock cycle, and data values D3 and D4 are transmitted during the subsequent clock cycle. The data values stored in read data buffer 504 are transferred to CPU bus 204 at the normal data rate of one data value per cycle of the CPU bus clock signal.

In another embodiment, read data buffer 504 is not used and the data values are transferred at the CPU bus data rate directly from DRAM array 317 to CPU bus 204. All internal RAS/CAS and precharge operations remain as illustrated in FIG. 10. The data values are transmitted on a single width data path directly to CPU bus 204, at a rate of one data value per cycle of the 1X clock signal. The external operation of DRAM second level cache memory 213 in this embodiment can still be compatible with standard PBSRAM. This mode of operation, however, requires the transfer of data values D3 and D4 from data amplifier circuit 312 to CPU bus 204 be performed in parallel with the RAS/CAS access of the next read operation (involving data values D1'–D4'). Care must be taken to minimize the potential internal bus contention problem which may exist between data values D4 and D1'

Figure 11:
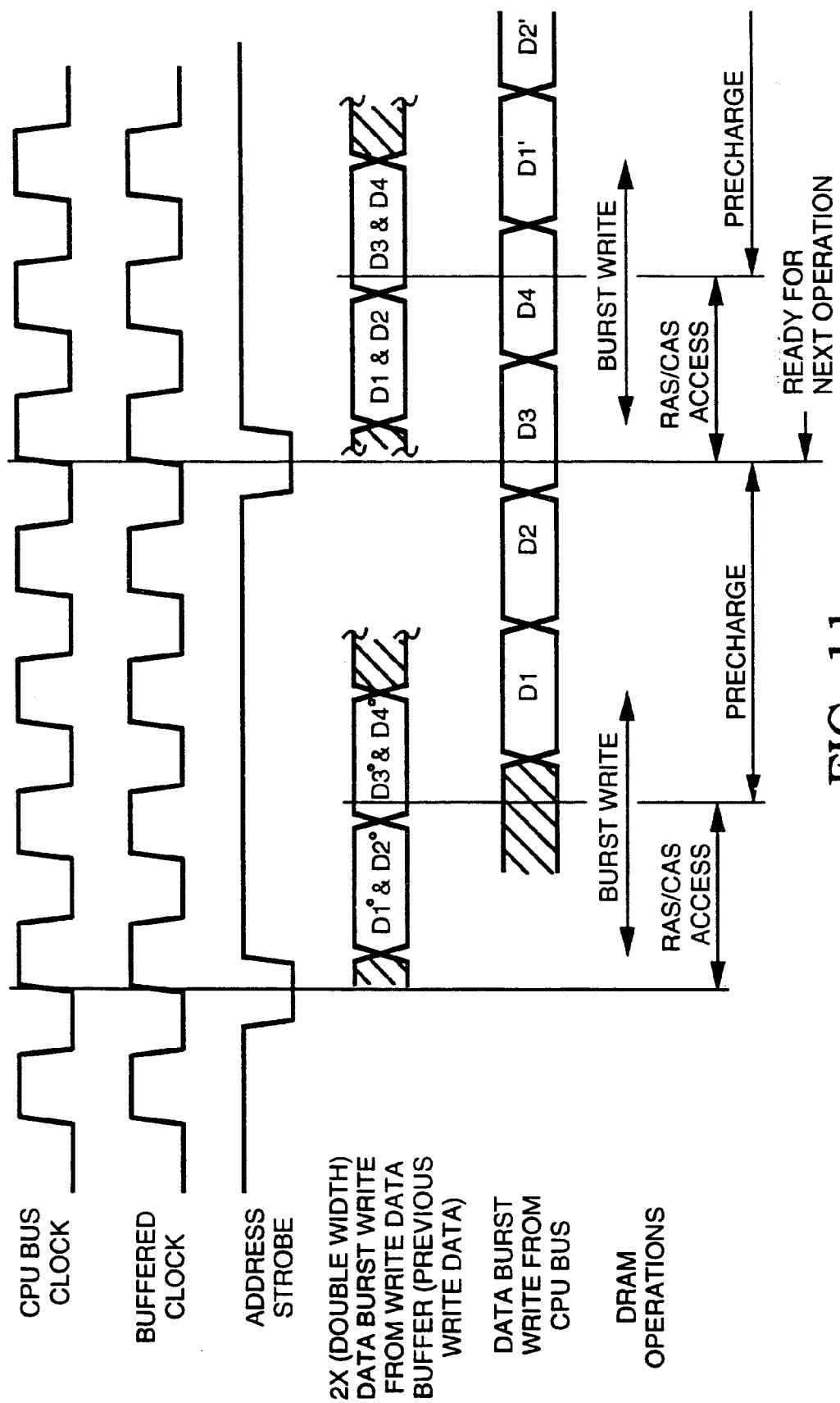
FIG. 11 is a timing diagram of a 3-1-1-1 DRAM second level cache write operation in accordance with an embodiment of the invention.

The data path between DRAM array 317 and write data buffer 506 can also be widened. FIG. 11 is a timing diagram of a 3-1-1-1 DRAM second level cache write operation which utilizes a widened wide data path between DRAM array 317 and write data buffer 506. In this embodiment, the 1X clock signal is used to launch internal operations of DRAM 317. The 1X clock signal can be generated by PLL circuit 501 or by simple clock buffering. Although not required by the invention, FIG. 11 illustrates the internal operation of DRAM array 317 with a double-wide internal data path between write data buffer 506 and DRAM array 317. This double-wide data path effectively doubles the internal data transfer rate. The RAS and CAS operations are launched after the address strobe signal (indicating a new transaction) is asserted. A data burst write operation from write data buffer 506 of previously written data values $D1_0$–$D4_0$ is performed to data amplifier circuit 312 in parallel with the RAS/CAS operation. After write data values $D1_0$–$D4_0$ have been transmitted from data amplifier circuit 312 to sense amplifier circuit 306, column selector 310 disconnects sense amplifier circuit 306 from data amplifier circuit 312. After column selector 310 is disconnects these elements, a precharge operation can start immediately, thereby allowing DRAM array 317 to operate with minimum cycle time. Meanwhile, write data buffer 506 accepts new write data values D1–D4 from CPU bus 204 at the normal data rate as determined by the CPU bus clock signal.

In an alternative embodiment, if a widened internal data path between write data buffer 506 and DRAM array 317 is not used, then the precharge operation will start two clocks cycles later than shown in FIG. 11, (i.e., after all of the previous write data values $D1_0$–$D4_0$ have arrived at DRAM array 317). In this embodiment, the minimum cycle time will be two clock cycles longer than in the embodiment described in connection with FIG. 11. The external operation of second level DRAM cache memory 213 in this embodiment will be slower than standard PBSRAM.

Refresh Management and Arbitration

Figure 12:
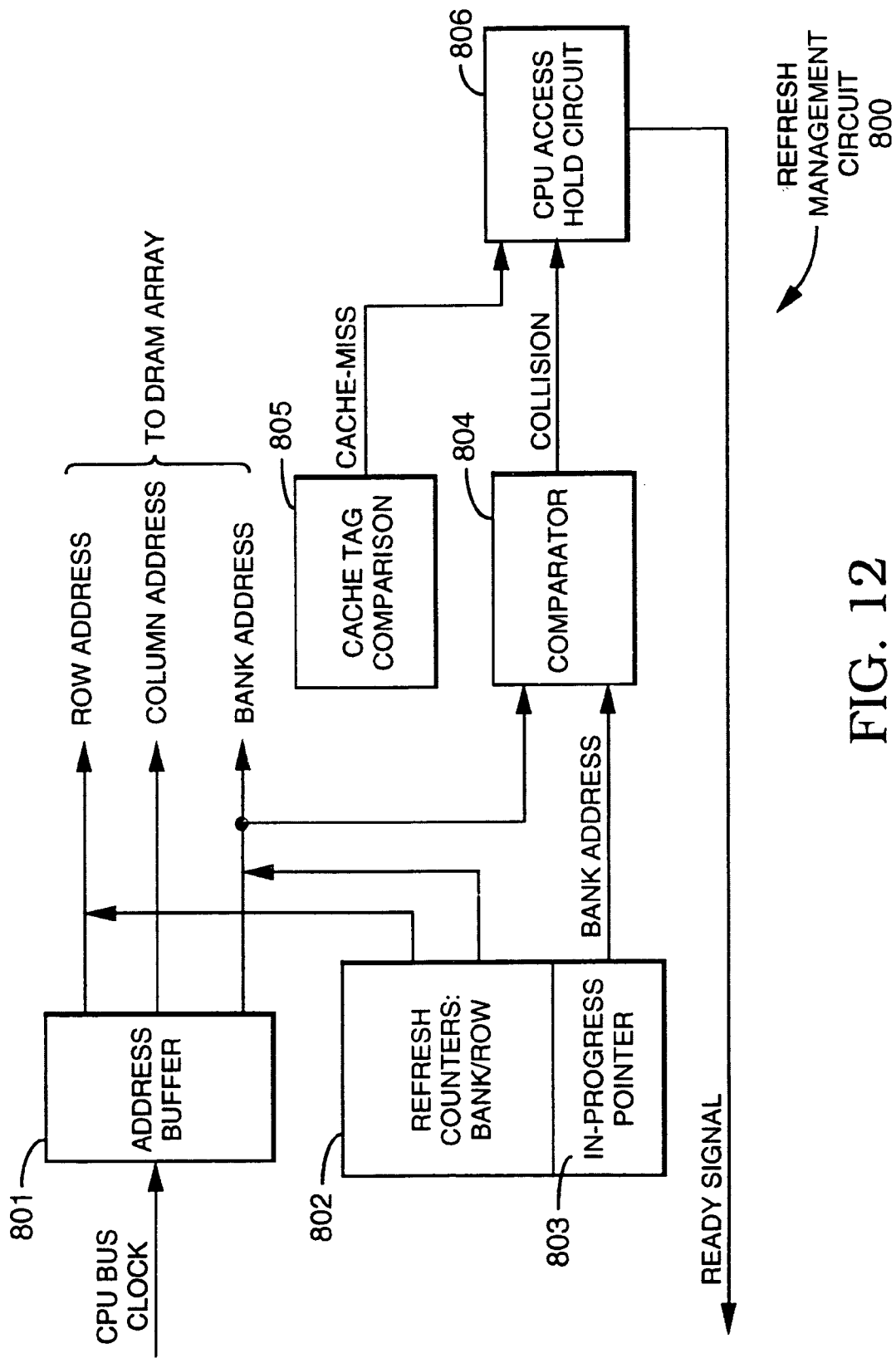
FIG. 12 is a schematic diagram of a refresh management controller.

Second level DRAM cache memory 213, with passive charge storage, requires refresh operations to periodically (typically every 4 to 64 ms) replenish the charges stored in each cell capacitor. This is because junction, transistor and dielectric leakage currents may cause the stored charge to leak out. FIG. 12 illustrates one embodiment of a refresh management circuit 800 which can be used in connection with the present invention. Refresh management circuit 800 consists of address buffer 801, refresh counters 802, in-progress pointer 803, comparator 804, cache tag comparator 805 and CPU access delay circuit 806. Refresh management circuit 800 is used in connection with an embodiment which uses multiple DRAM arrays (similar to DRAM array 317) within second level DRAM cache 213.

Refresh counters 802 keep track of the addresses of the DRAM arrays and rows to be refreshed next. Refresh counters 802 periodically initiate a RAS/PRECHARGE operation to the DRAM arrays and rows indicated by the refresh counters 802 by transmitting signals selecting these arrays and rows to the appropriate DRAM array(s). In-progress pointer 803 indicates the address of the DRAM array currently being refreshed. Each refresh operation typically lasts 40 to 60 ns.

Any CPU bus access request initiates a comparison to see if there is cache hit in the second level DRAM cache memory 213. At the same time, if there is a refresh operation in progress, the contents of in-progress pointer 803 (the DRAM array address for a single array refresh, or the high order bits of the DRAM array address for a group array refresh) are compared by comparator 804 to the address of the requested DRAM array. Any collision (match of array addresses) will cause CPU access delay circuit 806 to delay CPU access until the refresh operation is completed, in-progress pointer 803 is cleared, and the appropriate ready signal is sent from CPU access delay circuit 806 to the CPU bus. The delay of CPU access delay circuit 806 is set to a predetermined time based on the known timing of the refresh operation. By partitioning second level DRAM cache memory 213 into multiple banks, the probability of a collision during a refresh operation is proportionately reduced.

PBSRAM Compatible Embodiment

FIG. 13 is schematic diagram illustrating a computer system 1300 which includes CPU 1301, CPU bus 1304, second level cache tag memory 1308, system controller 1313, system bus 1318, second level DRAM cache memory 1313, main DRAM memory 1314 and data path 1326. Computer system 1300 is shown in a PBSRAM compatible environment with key signal pins illustrated. In this embodiment, second level DRAM cache memory 1313 includes two 32K×32 DRAM memory arrays 1340 and 1341 with pin-out and connections being compatible with standard PBSRAM. Standard PBSRAM utilizes the following signals: address input signals AD[18:3], bi-directional data signals D[63:0], CPU-initiated address strobe input signal ADSP#, clock input signal CLK, controller-initiated address strobe input signal ADSC#, counter advance input signal ADV#, output enable input signal OE#, various chip enable input signals CE1#, CE2 and CE3#, byte write enable input signal BWE#, global write input signal GW#, and individual byte write control input signals BW#[7:0]. These signals are described in more detail in "Pentium™ Processor 3.3V Pipelined BSRAM Specification", Version 1.2, Intel Corporation, Oct. 5, 1994.

The present invention utilizes several signals in addition to those enumerated above. Thus, each of DRAM arrays 1340 and 1341 receives from CPU 1301 a write/read identification (W/R#) signal which defines the nature (i.e., read or write) of a CPU-initiated ADSP# signal. Each of DRAM cache arrays 1340 and 1341 also provides and/or receives a refresh management (Krdy) signal to system controller 1311. The Krdy signal is used to control the management of refresh and internal operations of DRAM arrays 1340 and 1341. Each of DRAM cache arrays 1340 and 1341 also receives a Reset# signal from CPU 1301 for general initialization and synchronization during power up operations.

Figure 14A:
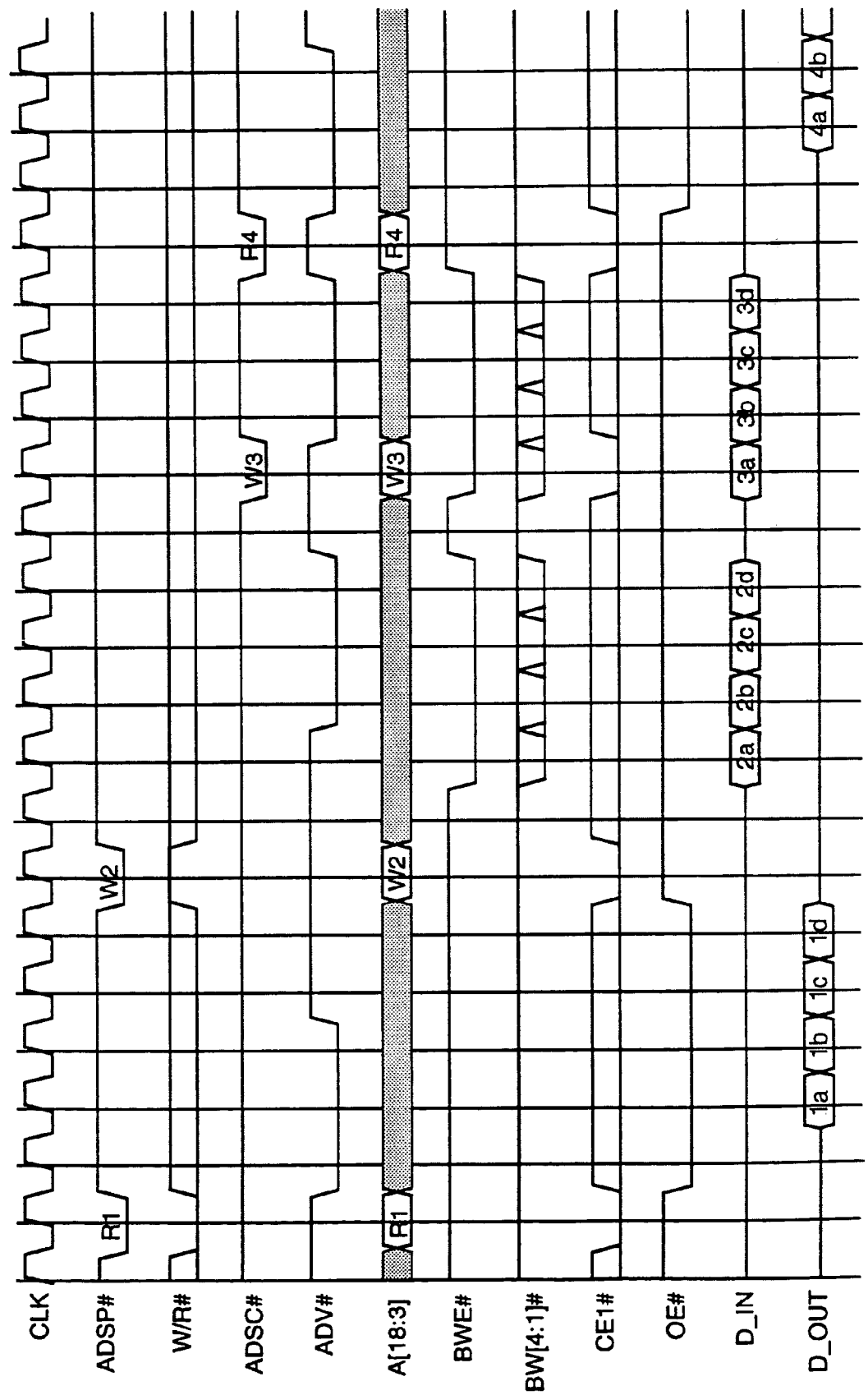
FIGS. 14a and 14b are timing diagrams of transaction-based DRAM second level cache read and write operations in accordance with an embodiment of the invention.

FIG. 14a is a timing diagram of transaction-based DRAM second level cache burst read and write operations using the signals illustrated in FIG. 13. The timing diagram of FIG. 14a is compatible with the requirements of standard PBSRAM. The signal definitions and operations for the ADSP#, ADSC#, ADV#, CLK, GW#, BWE#, BW#'s, CE#, and OE# signals are the same as those of PBSRAM. In a preferred embodiment, the W/R#, BWE# and GW# signals are used in conjunction with the ADSP# and ADSC# signals to uniquely define each transaction. When the ADSP# signal is asserted low at the start of an ADSP# initiated transaction (shown as R1 & W2 in FIG. 14a), the W/R# signal must be valid to indicate whether a read or write operation is to be performed. In FIG. 14a, a low W/R# signal indicates a read transaction and a high W/R# signal indicates a write transaction. In FIG. 14a, the chip enable (CE1#) signal must be initially low at the beginning of the R1 and W2 operations for these operations take place within DRAM arrays 1340 and 1341.

When the ADSC# signal is asserted low at the start of an ADSC# initiated transaction (shown as W3 & R4 in FIG. 14a), the BWE# and GW# signals are used to indicate whether a read or write transaction is to be performed. If either the BWE# signal or the GW# signal (not shown) is low, a write transaction is performed. If neither the BWE# signal nor the GW# signal is low, a read transaction is performed. At the beginning of the W3 and R4 operations, the CE1# signal must be in a low state to cause the W3 and R4 operations to take place within DRAM arrays 1340 and 1341. The burst read and burst write operations illustrated in FIG. 14a are performed in accordance with one of the embodiments previously described in connection with FIGS. 10–11.

Figure 14B:
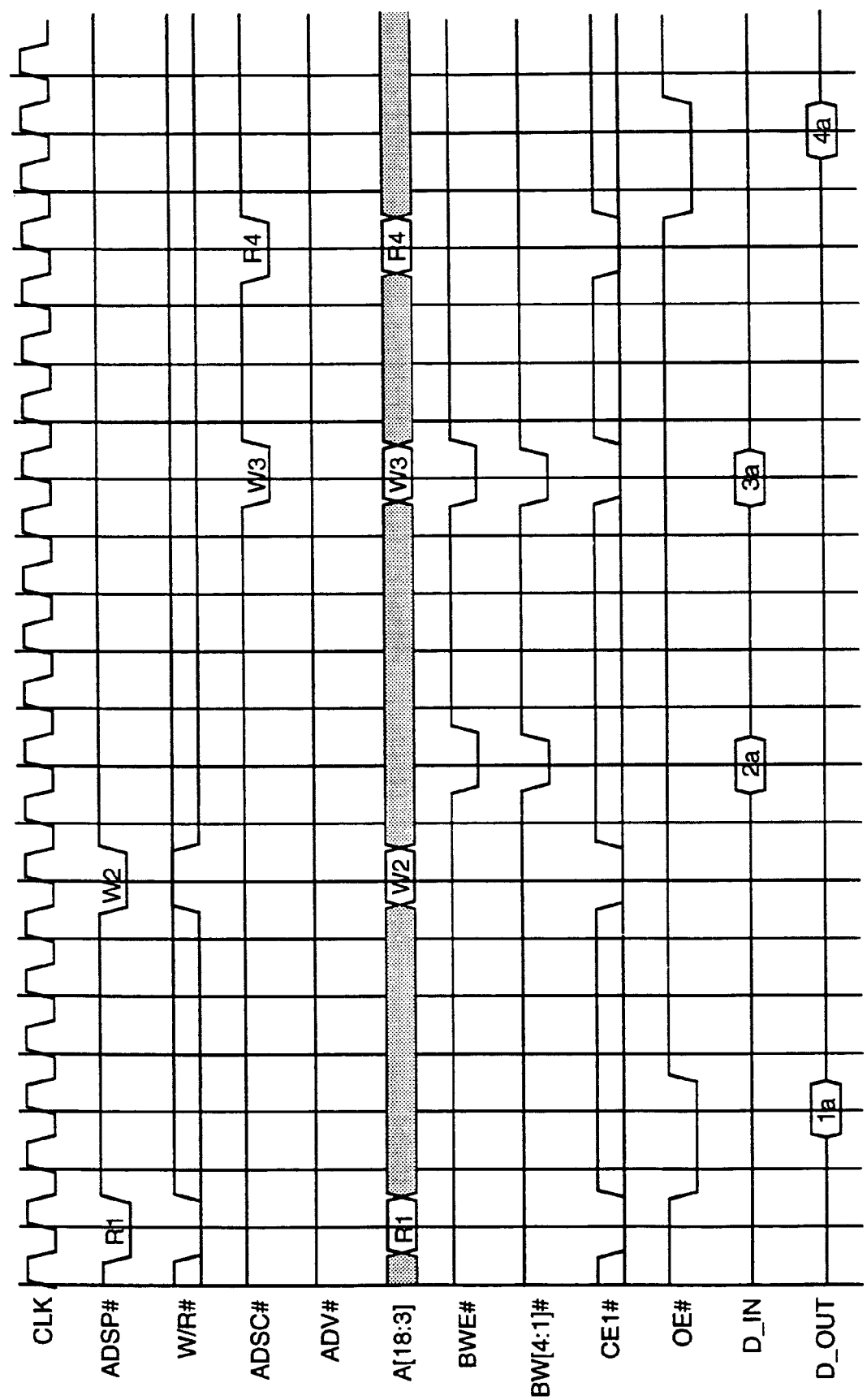

FIG. 14b is a timing diagram of transaction-based DRAM second level cache single read and write operations using the signals illustrated in FIG. 13. The timing of the signals in FIG. 14b is similar to the timing of the signals in FIG. 14a, except for the length of the data phase.

Figure 15:
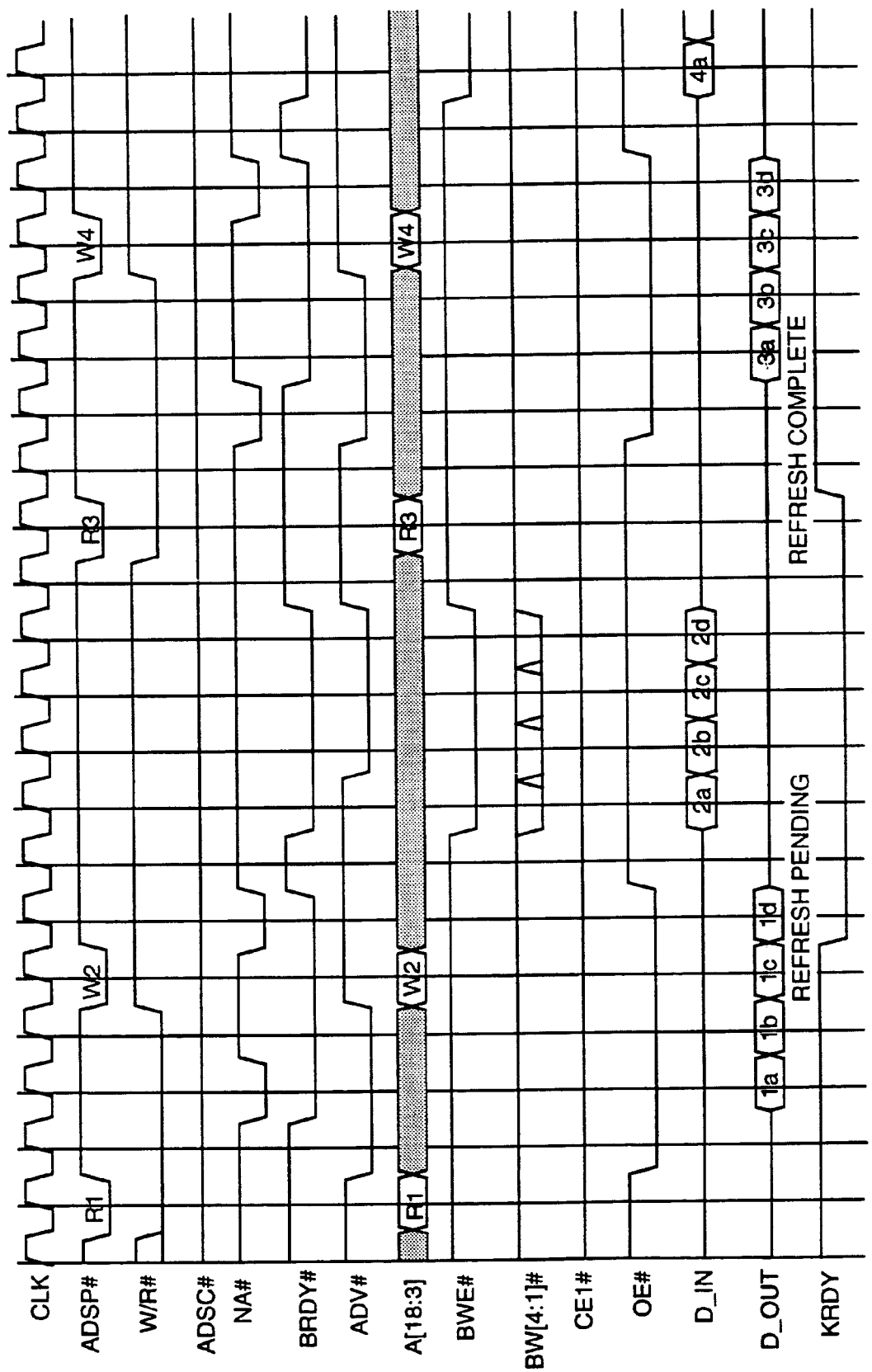
FIG. 15 is a timing diagram of a handshake protocol of a cache ready signal for a DRAM second level cache.

FIG. 15 is a timing diagram which illustrates the handshake protocol of the Krdy signal in computer system 1303 (FIG. 13). The signals illustrated in FIG. 15 are the same signals previously described in connection with FIGS. 13 and 14a–14b, with the exception of the NA# and BRDY# signals. The NA# and BRDY# signals are generated by system controller 1311 and sent directly to CPU 1301. The NA# signal indicates that system controller 1311 is ready for next address and the BRDY# signal indicates that data values are ready on CPU bus 1304. The Krdy signal is used to control the refresh management of second level DRAM cache memory 1313.

The falling edge of the Krdy signal indicates there is a pending refresh or other internal operation request, and the rising edge of the Krdy signal indicates the refresh or other internal operation has been completed. The polarity of the Krdy signal is chosen arbitrarily, and opposite polarity can be used to accomplish the same effect. Both DRAM cache memory 1313 and system controller 1311 shall sample the Krdy signal at least at the beginning of each new transaction, whether the transaction is initiated by the ADSP# or ADSC# signal.

In one embodiment, the handshake protocol of the Krdy signal is as follows. If the Krdy signal is high at the start of a new transaction, then this transaction will proceed to completion normally. However, if the Krdy signal is low at the start of a new ADSC# transaction, and the Krdy signal has just entered this low state (within the last clock cycle), the ADSC# transaction will proceed to completion and be followed by a refresh operation. If the Krdy signal has been low for more than one clock cycle, the ADSC# transaction will be delayed until the Krdy signal goes high again.

If the Krdy signal is low at the start of a new ADSP# transaction, then the ADSP# transaction will be delayed until the Krdy signal goes high. Alternatively, the handshake protocol for ADSP# transactions can be defined in a similar manner as the handshake protocol for the ADSC# transactions. Thus, if the Krdy signal is low at the start of a new ADSP# transaction and the Krdy signal has just entered this low state (within the last clock cycle), the ADSP# transaction will proceed to completion and be followed by a refresh operation. If the Krdy signal has been low for more than one clock cycle, the ADSP# transaction will be delayed until the Krdy signal goes high again.

In another handshake protocol, system controller 1311 will also sample the status of the Krdy signal when there is a pending ADSC# transaction. If the Krdy signal is low, then the ADSC# transaction will be delayed until the Krdy signal goes high. Otherwise, the pending ADSC# transaction is initiated.

The Krdy signal can be used for multiple purposes. In another embodiment, the Krdy signal is implemented as an input/output signal. When multiple DRAM arrays (e.g., arrays 1340 and 1341 in FIG. 13) are used together for memory width or depth expansion or both, the Krdy signal can be used for synchronizing the DRAM refresh and/or internal operation among the multiple devices. For example, DRAM array 1340 can be designated as a master device for refresh management. This master DRAM array 1340 uses the Krdy signal to communicate with system controller 1311 and control the refresh management function. Each of the remaining DRAM cache memory devices (e.g., DRAM array 1341) shares the Krdy signal line and are designated as slave devices. Each slave device samples the state of the Krdy signal to control or initiate its own refresh or internal operation in a manner consistent with the master device, thereby maintaining synchronization with the master device.

In a yet another embodiment, the Krdy signal is driven by system controller 1311, and each of DRAM arrays 1340 and 1341, upon detecting a low Krdy signal, will initiate and complete a pre-defined refresh operation.

Turning now to the embodiment illustrated in FIG. 15, after the ADSP# signal is asserted low to begin the W2 write transaction, the Krdy signal is pulled down to indicate that there is a pending refresh event. Since the Krdy signal is high when the ADSP# signal is asserted low, the W2 burst write transaction (involving data values 2a–2d) is executed to completion in a normal manner. When the W2 burst write transaction is completed, a refresh operation is initiated. A read (R3) transaction is subsequently initiated when the ADSP# signal is asserted low. At this time, the Krdy signal is still low because the refresh operation has not been completed. The low Krdy signal causes the R3 read transaction to be delayed until the refresh operation is completed. In this example, the R3 read transaction is delayed by one clock cycle. Even if the ADSP# signal for the R3 read transaction starts earlier than shown in FIG. 15, the R3 read transaction is delayed until the clock cycle shown in FIG. 15 (i.e., the operation is delayed until after Krdy returns high).

The handshake protocol of the Krdy signal can also be implemented in other manners. In one variation, the refresh-pending request is initiated from DRAM cache memory 1313 using the Krdy pin, and system controller 1313 returns an acknowledgment signal on a separate pin to DRAM cache memory 1313 to instruct DRAM cache memory 1313 to start the refresh operation. The, Krdy signal is then driven high by DRAM cache memory 1313 upon completion or pending completion of the refresh operation. This arrangement allows more flexibility in the design of system controller 1313 because controller 1313 can control when the refresh operation actually begins.

In another variation, DRAM cache memory 1313 drives the Krdy signal pin to indicate a refresh-pending condition and system controller 1318 drives the Krdy signal pin to indicate a refresh-start condition. In this arrangement, the number of clock cycles required to perform the refresh operation is fixed and both DRAM cache memory 1313 and system controller 1318 have counters which allow these devices to track the refresh operation in a consistent fashion.

Although the invention has been described in connection with several embodiments, it is understood that this invention is not limited to the embodiments disclosed, but is capable of various modifications which would be apparent to one of ordinary skill in the art. Thus, the invention is limited only by the following claims.

What is claimed is:

1. A high speed memory system comprising:
    a dynamic random access memory (DRAM); and
    a memory control sequencer for accessing the DRAM, wherein the memory control sequencer generates a row access signal and a column access signal for controlling the memory operations of the DRAM in response to at least an external access signal and a clock signal;
    wherein the memory control sequencer comprises circuitry for detecting the reception of the external access signal during a first clock phase of the clock signal, asserting the row access signal during the first clock phase, asserting the column access signal during a second clock phase of the clock signal, completing a memory access of the DRAM associated with asserting the row access signal and the column access signal during a third clock phase of the clock signal, and precharging the DRAM during the third clock phase of the clock signal.

2. The memory system of claim 1, wherein the first clock phase and the second clock phase combined have a duration less than one cycle of the clock signal.

3. The memory system of claim 1, wherein the second clock phase is less than one clock cycle after the start of the first clock phase.

4. The memory system of claim 1, wherein the third clock phase is less than one clock cycle after the start of the second clock phase.

5. The memory system of claim 1, further comprising:
    a row address register configured to latch a row address used to access a row of the DRAM;
    a column address register configured to latch a column address used to access a column of the DRAM; and
    a control circuit that causes the row address to be latched in the row address register before the column address is latched in the column address register.

6. A method of operating a memory array, the method comprising the acts of:
    initiating a read access to the memory array during a first clock phase;
    reading a first set of data values from the memory array during a second clock phase;
    storing the first set of data values read from the memory array in a first data storage circuit during the second clock phase;
    isolating the first data storage circuit from the memory array during a third clock phase;
    reading the first set of data values from the first data storage circuit during the third clock phase; and
    precharging the memory array during the third clock phase.

7. The method of claim 6, further comprising the acts of:
    performing a row access operation on the memory array during the first clock phase;
    performing a column access operation on the memory array during the second clock phase, thereby reading the first set of data values from the memory array.

8. The method of claim 6, wherein the first clock phase and the second clock phase combined have a duration less than one cycle of a clock signal used to read the first set of data values from the first data storage circuit.

9. The method of claim 6, wherein the second clock phase is less than one clock cycle after the start of the first clock phase.

10. The method of claim 6, wherein the third clock phase is less than one clock cycle after the start of the second clock phase.

11. The method of claim 6, further comprising:
    latching a row address associated with the read access during the first clock phase; and
    latching a column address associated with the read access after latching the row address.

* * * * *